(12) United States Patent
Germagian et al.

(10) Patent No.: US 7,259,963 B2
(45) Date of Patent: Aug. 21, 2007

(54) RACK HEIGHT COOLING

(75) Inventors: Mark Germagian, Hudson, MA (US);
James VanGilder, Pepperell, MA (US);
Jason Dudek, Seattle, WA (US)

(73) Assignee: American Power Conversion Corp.,
West Kingston, RI (US)

( * ) Notice: Subject to any disclaimer, the term of this patent is extended or adjusted under 35 U.S.C. 154(b) by 329 days.

(21) Appl. No.: 11/025,567

(22) Filed: Dec. 29, 2004

(65) Prior Publication Data

US 2006/0139877 A1 Jun. 29, 2006

(51) Int. Cl.
*H05K 7/20* (2006.01)

(52) U.S. Cl. ............... 361/695; 361/690; 361/691; 361/692; 361/693; 361/694; 361/696; 454/184

(58) Field of Classification Search ............... 361/679, 361/680, 686, 687, 690–698, 724–727, 730, 361/732; 454/184, 186; 165/121–127, 80.4, 165/104.27; 62/259.2; 312/223.21, 223.3
See application file for complete search history.

(56) References Cited

U.S. PATENT DOCUMENTS

| | | | |
|---|---|---|---|
| 3,559,728 A | 2/1971 | Lyman et al. ................ | 165/55 |
| 4,016,357 A | 4/1977 | Abrahamsen ................ | 174/48 |
| 4,158,875 A | 6/1979 | Tajima et al. ............... | 361/384 |
| 4,261,519 A | 4/1981 | Ester ........................ | 239/548 |
| 4,350,026 A | 9/1982 | Klein ........................ | 62/333 |
| 4,710,096 A | 12/1987 | Erlam ....................... | 415/121 G |
| 4,774,631 A | 9/1988 | Okuyama et al. ........... | 361/384 |
| 4,832,717 A | 5/1989 | Peters ....................... | 55/473 |
| 4,837,663 A | 6/1989 | Zushi et al. ................ | 361/384 |
| 4,851,965 A | 7/1989 | Gabuzda et al. ............ | 361/383 |
| 4,874,127 A | 10/1989 | Collier ...................... | 236/49.5 |
| 4,911,231 A | 3/1990 | Horne et al. ............... | 165/104.34 |
| 5,173,819 A | 12/1992 | Takahashi et al. .......... | 360/97.03 |
| 5,206,772 A | 4/1993 | Hirano et al. .............. | 360/98.01 |
| 5,232,401 A | 8/1993 | Fujita et al. ................ | 454/187 |
| 5,409,419 A | 4/1995 | Euchner et al. ............ | 454/184 |
| 5,416,427 A | 5/1995 | Tracewell .................. | 324/754 |
| 5,422,767 A | 6/1995 | Hatchett et al. ............ | 360/98.01 |
| 5,497,288 A | 3/1996 | Otis et al. .................. | 361/687 |
| 5,544,012 A | 8/1996 | Koike ....................... | 361/695 |
| D375,725 S | 11/1996 | Dodson ..................... | 257/706 |
| 5,657,641 A | 8/1997 | Cunningham et al. ....... | 62/263 |
| 5,671,805 A | 9/1997 | Ståhl et al. ................. | 165/80.3 |
| 5,673,029 A | 9/1997 | Behl et al. ................. | 340/635 |

(Continued)

FOREIGN PATENT DOCUMENTS

DE 198 17 917 A1 10/1999

(Continued)

*Primary Examiner*—Michael Datskovskiy
(74) *Attorney, Agent, or Firm*—Kyle Turley; Mintz, Levin, Cohn, Ferris, Glovsky and Popeo, P.C.

(57) ABSTRACT

A data center includes an electronic equipment rack having a front face and a back face and a cooling unit positioned adjacent to the rack, the cooling unit having a front face and a back face, the cooling unit being configured to exhaust cooled air from the front face of the cooling unit to cool the rack. The cooling unit is configured to release the cooled air along a substantial portion of a height of the front face of the rack.

16 Claims, 30 Drawing Sheets

U.S. PATENT DOCUMENTS

| | | | |
|---|---|---|---|
| 5,709,100 A | 1/1998 | Baer et al. ............... 62/259.2 |
| 5,718,628 A | 2/1998 | Nakazato et al. ........... 454/184 |
| 5,788,467 A | 8/1998 | Zenitani et al. ............ 417/360 |
| 5,923,496 A | 7/1999 | Perona ..................... 360/96.1 |
| 5,927,386 A | 7/1999 | Lin .......................... 165/80.3 |
| 5,934,368 A | 8/1999 | Tanaka et al. ............... 165/233 |
| 5,943,219 A | 8/1999 | Bellino et al. .............. 361/816 |
| 5,949,646 A | 9/1999 | Lee et al. .................. 361/695 |
| 5,969,941 A | 10/1999 | Cho .......................... 361/687 |
| 5,970,729 A | 10/1999 | Yamamoto et al. ........... 62/178 |
| 5,982,652 A | 11/1999 | Simonelli et al. ........... 363/142 |
| 6,034,873 A | 3/2000 | Ståhl et al. ................. 361/701 |
| 6,041,851 A | 3/2000 | Diebel et al. ............. 165/104.33 |
| 6,065,531 A | 5/2000 | Schneider et al. ........... 165/122 |
| 6,075,698 A | 6/2000 | Hogan et al. ................. 361/695 |
| 6,088,660 A | 7/2000 | Uno et al. .................... 702/130 |
| 6,164,369 A | 12/2000 | Stoller .................. 165/104.33 |
| 6,168,396 B1 | 1/2001 | Homola ................. 417/423.14 |
| 6,185,065 B1 | 2/2001 | Hasegawa et al. ....... 360/97.02 |
| 6,185,097 B1 | 2/2001 | Behl .......................... 361/695 |
| 6,185,098 B1 | 2/2001 | Benavides .................. 361/695 |
| 6,185,481 B1 | 2/2001 | Kondou et al. ............. 700/275 |
| 6,186,890 B1 | 2/2001 | French et al. ............... 454/184 |
| 6,193,601 B1 | 2/2001 | Torczynski ................. 454/187 |
| 6,198,628 B1 | 3/2001 | Smith ........................ 361/695 |
| 6,222,729 B1 | 4/2001 | Yoshikawa .................. 361/695 |
| 6,264,550 B1 | 7/2001 | Matsumoto ................. 454/184 |
| 6,290,597 B1 | 9/2001 | Jones et al. ................. 454/303 |
| 6,297,950 B1 | 10/2001 | Erwin ........................ 361/685 |
| 6,305,180 B1 | 10/2001 | Miller et al. .............. 62/259.2 |
| 6,327,143 B1 | 12/2001 | Bonstrom et al. ........... 361/683 |
| 6,347,627 B1 | 2/2002 | Frankie et al. ......... 128/201.21 |
| 6,359,565 B1 | 3/2002 | Pedoeem et al. ........... 340/584 |
| 6,362,958 B1 | 3/2002 | Yu et al. ..................... 361/695 |
| 6,374,627 B1 | 4/2002 | Schumacher et al. ...... 62/259.2 |
| 6,375,561 B1 | 4/2002 | Nicolai et al. ............... 454/184 |
| 6,396,689 B1 | 5/2002 | Yu et al. ..................... 361/687 |
| 6,400,567 B1 | 6/2002 | McKeen et al. ............ 361/695 |
| 6,412,292 B2 | 7/2002 | Spinazzola et al. ............ 62/89 |
| 6,414,845 B2 | 7/2002 | Bonet ........................ 361/695 |
| 6,434,954 B1 | 8/2002 | Hess et al. ..................... 62/89 |
| 6,459,579 B1 | 10/2002 | Farmer et al. .............. 361/695 |
| 6,463,997 B1 | 10/2002 | Nicolai et al. ............. 165/80.2 |
| 6,494,050 B2 | 12/2002 | Spinazzola et al. ............ 62/89 |
| 6,506,111 B2 | 1/2003 | Sharp et al. ................ 454/184 |
| 6,516,954 B2 | 2/2003 | Broome ....................... 211/26 |
| 6,535,382 B2 | 3/2003 | Bishop et al. .............. 361/690 |
| 6,574,104 B2 | 6/2003 | Patel et al. ................. 361/695 |
| 6,583,991 B1 | 6/2003 | Furuta et al. ............... 361/752 |
| 6,616,524 B2 * | 9/2003 | Storck et al. ............... 454/184 |
| 6,672,955 B2 * | 1/2004 | Charron ..................... 454/184 |
| 6,704,196 B1 | 3/2004 | Rodriguez et al. .......... 361/687 |
| 6,746,502 B2 | 6/2004 | Yair et al. .................. 55/385.6 |
| 6,788,535 B2 | 9/2004 | Dodgen et al. ............. 361/695 |
| 6,819,563 B1 * | 11/2004 | Chu et al. ................... 361/696 |
| 6,836,407 B2 | 12/2004 | Faneuf et al. ............... 361/687 |
| 6,859,366 B2 * | 2/2005 | Fink .......................... 361/690 |
| 6,862,179 B2 | 3/2005 | Beitelmal et al. ........... 361/687 |
| 6,924,981 B2 * | 8/2005 | Chu et al. ................... 361/696 |
| 6,997,006 B2 | 2/2006 | Kameyama et al. ........ 62/259.2 |
| 7,003,971 B2 | 2/2006 | Kester et al. ............... 62/259.2 |
| 7,051,802 B2 * | 5/2006 | Baer ........................... 165/299 |
| 7,085,133 B2 * | 8/2006 | Hall ........................... 361/695 |
| 7,145,772 B2 * | 12/2006 | Fink .......................... 361/695 |
| 2001/0029163 A1 | 10/2001 | Spinazzola et al. ......... 454/184 |
| 2001/0042616 A1 | 11/2001 | Baer ........................... 165/299 |
| 2002/0007643 A1 | 1/2002 | Spinazzola et al. ........ 62/259.2 |
| 2002/0185262 A1 | 12/2002 | Baer ...................... 165/104.22 |

FOREIGN PATENT DOCUMENTS

| | | |
|---|---|---|
| DE | 101 28 367 A1 | 1/2003 |
| EP | 0 190 835 A1 | 8/1986 |
| EP | 0 621 451 A2 | 10/1994 |
| FR | 2 193 303 | 2/1974 |
| FR | 2 831 019 | 4/2003 |
| JP | 62-202949 | 9/1987 |
| JP | 63-222916 | 9/1988 |
| JP | 1-273395 | 11/1989 |
| JP | 2-98197 | 4/1990 |
| JP | 2-192534 | 7/1990 |
| JP | 3-85797 | 4/1991 |
| JP | 3-177096 | 8/1991 |
| JP | 4-368199 | 12/1992 |
| JP | 5-106888 | 4/1993 |
| JP | 5-235570 | 9/1993 |
| JP | 5-332568 | 12/1993 |
| JP | 7-228249 | 8/1995 |
| JP | 10-322059 | 12/1998 |
| JP | 2003-166729 | 6/2003 |
| WO | WO98/45934 | 10/1998 |
| WO | WO 01/62060 A1 | 8/2001 |
| WO | WO 02/12797 A2 | 2/2002 |

* cited by examiner

RACK HEIGHT COOLING

FIELD OF THE INVENTION

Embodiments of the invention are directed to cooling of electronic devices, and more particularly to cooling electronic devices held in equipment racks.

BACKGROUND OF THE INVENTION

Electronic equipment racks are generally designed to receive a number of electronic components arranged vertically in the rack, mounted on shelves, and/or to front and rear mounting rails. The electronic equipment may include, for example, printed circuit boards, communications equipment, computers, including computer servers, or other electronic components.

Electronic equipment housed in racks produces a considerable amount of heat, which undesirably affects performance and reliability of the electronic equipment. Often the heat produced by the rack-mounted components is not evenly distributed in the racks. Inadequate supply of cool air and hot air recirculation can reduce equipment reliability substantially and can cause other performance problems. Accordingly, rack-mounted computer systems typically require effective cooling systems to maintain operational efficiency. Cooling can be accomplished by introducing cooled air into an equipment rack and causing the air to flow through equipment in the rack to remove some or all of the heat. The air exits the rack at an increased temperature.

A conventional solution for cooling racks of electronic equipment is to position the equipment racks in rows on a raised floor in a hot aisle and cold aisle configuration, with the fronts of the equipment racks in one row facing the fronts of the equipment racks in an adjacent row. Air cooled by a central air conditioning system is ducted under the raised floor, and perforated or vented floor tiles are provided in the cold aisles to release chilled air towards the fronts of the equipment racks. Chilled air is then drawn into the equipment mounted in the rack and heated air is exhausted out the back of each rack into the hot aisle.

The raised floor solution for cooling electronic equipment in data centers has several drawbacks. Raised floors are expensive, and may provide poor recirculation and delivery of air, particularly as the power density of equipment in racks is increasing. For example, releasing cooled air from a floor plenum is impractical, as there is a need for great volumes of cooled air to be pumped into the floor plenum before cooling can be effective. Even when great volumes of air are pumped into the floor plenums, chilled air exiting the perforated floor tiles may not reach the equipment mounted in the top portion of the equipment rack. Thus, equipment is often only loaded into lower portions of the racks, leaving a substantial area in the tops of the racks unused. Still further, it is not uncommon for warm air to travel back down into the floor plenums. Cutouts for equipment and cabling, gaps around tiles, and open tiles in the floor can lead to up to a 50% or greater loss of cooled air due to leakage, creating substantial inefficiency. Cabling and cooling lines are located below the floor, obstructing the path of the air as it moves toward the racks, which further creates inefficient cooling. Often, in data centers having raised floor solutions, the cooling units are located in the corners or on the edges of the rooms, causing racks in the center of the aisles or rooms to receive a substantially different volume of cool air than racks located near the perimeter of the room.

In addition, data rooms having raised floor cooling systems often require modifications, including modifications to allow for the addition or removal of equipment racks. Modifications can be problematic in a raised floor room. For example, a substantially large space is necessary to accommodate changes to the data center, as equipment being added or removed requires a ramp to move the equipment onto the raised floor. Also, in some data centers, the hot air is returned through the ceiling, requiring ceiling venting and ducts that may require substantial adjustment as other changes to the data center occur.

Further, the overall efficiency, cost, reliability and cooling capacity of a cooling system in a data center is directly related to the ability to prevent mixing of cooling air and warm exhaust air in the data center. Thus, effective cooling and air mixing separation methods are required.

SUMMARY OF THE INVENTION

A first aspect of the invention comprises a data center. The data center includes an electronic equipment rack having a front face and a back face and a cooling unit positioned adjacent to the rack, the cooling unit having a front face and a back face, the cooling unit being configured to exhaust cooled air from the front face of the cooling unit to cool the rack. The cooling unit is configured to release the cooled air along a substantial portion of a height of the front face of the rack.

Embodiments of the invention may include one or more of the following features. The cooling unit can be configured to release the cooled air along substantially the full height of the front face of the rack. The data center can include an air turning member positioned on the front face of the cooling unit to direct the air toward the rack. The air turning member can be configured to direct air near the front face of the rack. The air turning member can be reversible. The air turning member can be expandable or retractable. The air turning member can be configured to direct air released from the cooling unit in more than one direction substantially simultaneously. An air turning member can be positioned in an internal portion of the cooling unit to deliver cooled air along substantially a portion of the height of the rack. The air turning member can be configured to direct air released from the cooling unit in more than one direction substantially simultaneously.

Embodiments of the invention may further include one or more of the following features. The cooling unit can be configured to receive air through the back face of the cooling unit along a substantial portion of the height of the rack. An air turning member can be positioned on a back face of the cooling unit along a substantial portion of the height of the rack and configured to receive air that is released from the back face of the rack. The data center can include a plurality of electronic equipment racks. The data center can include a plurality of cooling units. The data center can include a lower restriction panel coupled to one of the cooling unit and the rack, the lower restriction panel configured to substantially separate the air released from the cooling unit from surrounding air in the data center. The data center can include a lower restriction panel coupled to one of the cooling unit and the rack and configured to substantially separate the air released from the rack from surrounding air in the data center. The data center can include an upper restriction panel coupled to at least one of the cooling unit and the rack, the upper restriction panel positioned higher than a position of an opening in the at least one of the cooling unit and the rack configured to release air. The upper restriction panel can be coupled to at least one of a plurality of cooling units and a plurality of racks in the data center.

Embodiments of the invention may further include one or more of the following features. The data center may include a manifold, the manifold distributing a cooling fluid to the cooling unit to cool the air, wherein the cooling fluid is provided through at least one supply line connected to the manifold and to the cooling unit. The cooling unit can be configured to adjust an airflow rate of the cooled air based on at least one of the power load to the rack and the temperature of the air exhausted from the rack.

Additional aspects of the invention are directed to a method of cooling electronic equipment contained in racks in a data center. The method includes drawing air from an area proximal to a front face of an electronic equipment rack, the electronic equipment rack being configured to draw air into the front face of the rack and expel heated air from a back face of the rack, heating the drawn-in air in the rack, expelling the heated air from the back face of the rack, drawing the heated air into a back face of a cooling unit positioned proximal to the rack, cooling the air as the air passes through the cooling unit, and releasing the cooled air along substantially one of the height of the front face of the rack or a width of the front face of the rack.

Embodiments of the invention may include one or more of the following features. The method can include directing the cooled air toward the front face of the rack. The method can include restricting the cooled air released out of the front face of the cooling unit from mixing with ambient air. Restricting mixing can include at least partially blocking at least one of the area proximal to the front face of the rack and an area proximal to the back face of the rack from the remaining space in the data center. The stage of releasing can further comprise forcing air from a plenum positioned on a top portion of the racks. The method can further comprise adjusting an airflow rate of the cooled air released along substantially one of the height of the front face of the rack or the width of the front face of the rack.

Additional aspects of the invention can include a system for cooling equipment placed in racks in a data center. The system includes a plurality of racks, each of the racks having a front face and a back face, wherein the racks are arranged in a first row and a second row such that the front faces of the racks of the first row face the front faces of the racks of the second row, and at least one cooling unit positioned in the first row, the at least one cooling unit having a front face and a back face, wherein the front face of the at least one cooling unit faces the front faces of racks of the second row, the at least one cooling unit being configured to exhaust cooled air from the front face of the cooling unit to cool at least one of the plurality of racks. The at least one cooling unit is configured to release the cooled air along a substantial portion of a height of the front face of the at least one of the plurality of racks.

Embodiments of the invention can include one or more of the following features. The at least one cooling unit can include an air turning member configured to direct air released from the at least one cooling unit near the front faces of the plurality of racks in the data center. The system can include a lower restriction panel coupled to the at least one cooling unit and configured to substantially restrict mixing of the air released from the at least one cooling unit with surrounding air in the data center. The lower restriction panel can be configured to span most, but less than all, of the distance between the first row and the second row. The lower restriction panel can include a first door and a second door, and the first door can extend a distance from a cooling unit positioned in the first row and the second panel can extend a distance from a cooling unit positioned in the second row, and the first door and the second door can be configured to return to a closed position after opening.

Embodiments of the invention can include one or more of the following features. The system can include a lower restriction panel coupled to the at least one cooling unit and configured to substantially restrict mixing of the air released from at least one of the plurality of racks with surrounding air in the data center. The system can include an upper restriction panel connected to at least one of the plurality of racks and the at least one cooling unit in a position higher than a position of an opening in at least one of the plurality of racks and the at least one cooling unit configured to release air. The system can include an upper restriction panel is positioned in the first row and an upper restriction panel is positioned in the second row.

An additional aspect of the invention is directed to a data center. The data center includes a plurality of racks, each of the racks having a front face and a back face, wherein the racks are arranged in a first row and a second row such that the front faces of the racks of the first row face the front faces of the racks of the second row, and a cooling unit positioned in the first row, the cooling unit having a front face and a back face, wherein the front face of the cooling unit faces the front faces of racks of the second row, the cooling unit being configured to take in air through the back face, cool the air, and exhaust the cooled air. The cooling unit is configured to release the cooled air along a substantial portion of a height of the front face of the cooling unit.

Embodiments of the invention may include one or more of the following features. The cooling unit can be configured to release the cooled air along substantially the full height of the front face of the cooling unit. The cooling unit may provide a substantially uniform airflow over the substantial portion of the height of the front face of the cooling unit. An air distribution member may be coupled to the front face of the cooling unit. The air distribution member can be a curved member configured to direct air near the front face of the racks in the first row. Further, the air distribution member can be reversible, expandable, and/or retractable. The air distribution member can extend substantially the height of the front face of the cooling unit.

The data center may also include a first end panel coupled to the cooling unit, the first end panel spanning a portion of the distance between the first row and the second row. The first end panel can include at least one door configured to span a portion of the distance between the first row and the second row. The first end panel further includes a first door and a second door, and wherein the first door extends a distance from a cooling unit positioned in the first row and the second panel extends a distance from a cooling unit positioned in the second row. The first end panel may span the distance between the first row and the second row.

A further aspect of the data center may include a shield connected to at least one rack above an opening in the rack configured to release the air. The shield can be connected to at least one of the racks in the first row and configured to extend toward the racks in the second row, or the shield can be connected to a plurality of racks. A shield may be connected to each of the racks in the first row and to each of the racks in the second row, and the shields in the first row and the shields in the second row may extend toward each other. The shields in the first row and the shields in the second row can be configured to span a portion, but less than all, of the distance between the first row and the second row. The shield may be expandable and/or retractable. At least a portion of the shield may be translucent. The shield may include a planar member extending substantially vertically from a top portion of the rack. The shield may include a planar member extending substantially horizontally from a top portion of the rack and/or an arched member extending from a top portion of the rack. The shield can be comprised of at least one of metal, mesh, and plastic. The shield may further include at least one LED panel indicating a status temperature of the air. The data center may include a cable tray positioned on a top side of at least one of the racks to hold cables running to and from the rack, wherein the cable tray is configured to couple with the shield on the top side of the rack.

One or more of the following features may be included in embodiments of the invention. A second cooling unit may be positioned in the second row, the cooling unit having a front face and a back face, wherein the front face of the cooling unit faces the front faces of the racks of the first row. The second cooling unit can be located between a first rack of the second row and a second rack of the second row. The cooling unit can be positioned at an end of the first row. The cooling unit may be located between a first rack of the first row and a second rack of the first row. Further, the data center can include a manifold, the manifold distributing a cooling liquid to the at least one cooling unit to cool the air, wherein the cooling liquid is provided through at least one supply line connected to the manifold and to the at least one cooling unit. The data center can include a plurality of cooling units, and wherein the manifold includes at least one supply line for each of the plurality of cooling units. The cooling unit can be movable to be positioned in a plurality of locations in the first row and in the second row.

In addition, embodiments of the invention are directed to a method of cooling electronic equipment contained in racks in a data center. The method includes drawing air from an area between rows of the racks, including a first row and a second row that is substantially parallel to the first row, where a front face of at least one of the racks of the first row faces towards a front face of at least one of the racks of the second row, heating the drawn-in air in at least one of the racks, expelling the heated air from the at least one of the racks, drawing the heated air from the data center into a back side of a cooling unit in the first row, cooling the air as the air passes through the cooling unit, and releasing the cooled air along substantially one of the height of the cooling unit or a width of at least one of the racks in the rows.

The method of cooling may include one or more of the following stages. The method may further include directing the cooled air toward the front face of the remaining racks of the first row, restricting the cooled air released out of the front face of the cooling unit from mixing with ambient air, forcing air from a plenum positioned on a top portion of the racks, and monitoring a volume of the air released along substantially one of the height of the cooling rack or a width of at least one of the racks in the rows.

Aspects of the invention are further directed to a modular cooling unit for cooling electronic equipment contained in racks in a data center. The cooling unit includes a housing having a front face and a back face, at least one air vent positioned on the front face of the housing and extending a substantial portion of a height of the housing, and a directional member connected to the housing and extending at least a substantial portion of a height of the housing configured to direct air released from the at least one air vent over the substantial portion of the height of the housing.

Embodiments of the invention can include one or more of the following features. The cooling unit can be configured to provide substantially uniform airflow over the substantial portion of the height of the housing. The directional member may include a curved member configured to direct air in at least one of a right direction and a left direction with respect to the front face of the housing. The cooling unit can include at least one intake air vent on the back face of the housing, the at least one intake air vent configured to draw air into the housing. A second directional member can be coupled to the back face of the housing to direct intake air into the housing. The second directional member can include a curved member to direct the air into the housing along the height of the back face of the housing. The cooling unit can include a shield connected to the cooling unit in a position above the at least one air vent.

A still further embodiment of the invention includes a modular cooling unit for cooling electronic equipment positioned in racks in a data center. The cooling unit includes a housing having a front face and a back face and providing an air release vent positioned in the front face of the housing and means for directing air released from the air release vent along a height of the racks in the data center. The means for directing air can include at least one turning member positioned on the front face of the housing adjacent to the air release vent. The means for directing air can further include at least one turning member positioned on the front face of the housing at least partially over the position of the air release vent. The air release means can include at least one plenum positioned substantially horizontally on a top portion of the housing and the racks and having an outlet facing the front face of at least one of the racks. The means for directing air may include a turning member coupled to the plenum and directing air in a direction toward the front face of at least one of the racks. The cooling unit may include means for restricting air released from the air release vent from mixing with ambient air. The means for restricting mixing may include a shield coupled to the housing in a position above the air release vent. Further, the cooling unit may include means for monitoring the volumetric flow rate of the air released from the air release vent.

Yet another embodiment of the invention includes a data center having a plurality of racks, each of the racks having a front face and a back face, wherein the racks are arranged in a first row and a second row such that the front faces of the racks of the first row face the front faces of the racks of the second row, a plenum positioned proximal to the plurality of racks of the first row and the second row and configured to release cooled air along the front face of the racks through at least one aperture, wherein the plenum includes an air distribution member to direct air released through the at least one aperture toward the front face of the racks, and a cooling unit for supplying cooled air to the plenum.

The data center may include a plurality of cooling units positioned in the first row and the second row of racks. The racks may comprise an air intake vent, positioned on the front face of the racks, to draw in the cooled air from the cooling unit and direct the air into the plenum. The cooling unit may be positioned remotely from the racks, and the plenum may comprise an air intake vent to accept cooled air from the remote cooling unit and direct the cooled air toward the front face of the racks. The cooling unit may comprise a manifold, positioned remotely from the data center, the manifold including at least one cooling line to provide a liquid from the manifold to the data center to cool the air released toward the front face of the racks. The plenum can comprise a plurality of apertures, wherein each of the plurality of apertures is positioned to release cooled air in the direction of the front face of one of the racks in the first row and the second row.

A still further embodiment of the invention is directed to a modular data center having an electronic equipment rack having a front face and a back face, and a cooling unit positioned adjacent to the rack, the cooling unit having a front face and a back face, the cooling unit being configured to take in air through the back face, cool the air, and exhaust the cooled air, wherein the cooling unit is configured to release the cooled air along a substantial portion of a height of the front face of the cooling unit and direct the cooled air in a direction toward the front face of the rack. The cooling unit may include a monitoring device for monitoring at least one of a power load to the rack, the airflow, or a temperature of the air in the rack. The cooling unit can be configured to adjust an airflow rate of the cooled air based on at least one of the power load to the rack and the temperature of the air. The cooling unit may provide a substantially uniform airflow over the substantial portion of the height of the front face of the cooling unit.

Still further aspects of the invention are directed to an air distribution unit for use with cooling units and equipment racks, the air distribution unit including a body portion including a curved member, end caps connected to a first end and a second end of the body portion, and at least one attachment member, the at least one attachment member positioned on a back portion of the body portion and configured to connect with the cooling units and equipment racks, wherein the curved member is configured to expand and retract to direct air toward a front face of the equipment racks.

Another aspect of the invention includes an air mixing restriction member for use in a data center having a plurality of racks, each of the racks having a front face and a back face, wherein the racks are arranged in a first row and a second row such that the front faces of the racks of the first row face the front faces of the racks of the second row. The air mixing restriction member includes an air mixing shield configured to be positioned on a rack in a data center, the rack including at least one air vent, and an attachment mechanism, connected to the shield, for connecting the shield to the rack on a portion of the rack above the position of the air vent.

A further embodiment of the invention includes an air mixing restriction member for use in a data center having a plurality of racks, each of the racks having a front face and a back face, wherein the racks are arranged in a first row and a second row such that the front faces of the racks of the first row face the front faces of the racks of the second row, wherein a cool aisle is formed between the first row and the second row, the air mixing restriction member comprising a first planar portion coupled to a rack in the first row having a height substantially the height of the rack and configured to span most, but less than all, of the distance between the first row and the second row, a second planar portion coupled to a rack in the second row, the rack in the second row located opposite from the rack in the first row, the second planar portion having a height substantially the height of the rack and configured to span a portion of the distance between the second row and the first planar portion, and an attachment mechanism connected to the planar portion, for connecting the first planar portion to the first rack and for connecting the second planar portion to the second rack, such that the first planar portion and the second planar portion substantially restrict mixing of air in the cool aisle from ambient air.

Embodiments of the invention can also include a data center comprising at least one equipment rack having a front face and a back face, means for delivering cooled air in a direction toward the front face, and along substantially the height of the front face of the at least one equipment rack, and a return plenum positioned proximal to the at least one equipment rack and configured to collect air released from the back face of the at least one equipment rack.

Various features of the invention may provide one or more of the following capabilities. The cooling unit of the invention can be used in data centers that do not have raised floors, and provide improved efficiency over raised floor data centers. The cooling unit of the invention provides localized cooling solutions for matching the cooling needs of particular locations. Existing data centers can be modified to include aspects of the invention. Cooling units can be added or removed depending on the cooling needs of a particular data center. Cooling units can remain in position, but be modified to direct cooled air in a different direction or in more than one direction. A data room employing the cooling system can operate with little or no modification to its structure, i.e., data center lighting, sprinkler systems, security systems, etc., do not require modification when a cooling unit is added or removed from the data center.

Further, the cooling system of the invention is efficient. The invention allows for less opportunity for mixing of cold and hot air in a data center. The addition of upper restriction panels to the cooling units and equipment racks, and the addition of doors to the data rack rows creates a longer, more restrictive path that assists in preventing or restricting the hot air and the cool air from mixing. The cooling unit operates at a higher inlet temperature. The invention allows realization of higher capacity relative to traditional, remotely located cooling units. Cooling is substantially even from the top of racks to the bottom of the racks, allowing use of substantially the full height of a rack. Furthermore, the invention reduces the need for humidification/de-humidification.

The invention will be more fully understood after a review of the following figures, detailed description and claims.

DETAILED DESCRIPTION OF THE INVENTION

Embodiments of the invention provide techniques for cooling electronic equipment. Embodiments of the invention provide a modular cooling unit for cooling rack-mounted equipment, where the modular cooling unit provides a horizontally-moving stream of cool air to a row of rack enclosures by releasing cooled air from the cooling unit to be received along substantially the full height of the equipment racks. Embodiments of the invention may include a vertically-moving stream of cool air to a rack or a row of rack enclosures. Embodiments of the invention include air turning members to direct the air in a designated direction. Embodiments of the invention can include air flow restriction members positioned at various portions of the cooling unit and/or data center. Cooling is provided in some embodiments using redundant cooling units to help prevent downtime due to electrical or mechanical failures. Cooling can be provided in some embodiments using a cool air supply duct. Other embodiments are within the scope of the invention, such as embodiments used to provide a cooling solution for equipment other than electronic equipment or electronic equipment other than equipment mounted in racks.

Embodiments of the invention can effectively be used in conjunction with systems disclosed in U.S. application Ser. No. 10/391,971, filed Mar. 19, 2003 and entitled, "Data Center Cooling System," which is assigned to the Assignee of the present invention and is herein incorporated by reference.

Figure 1:
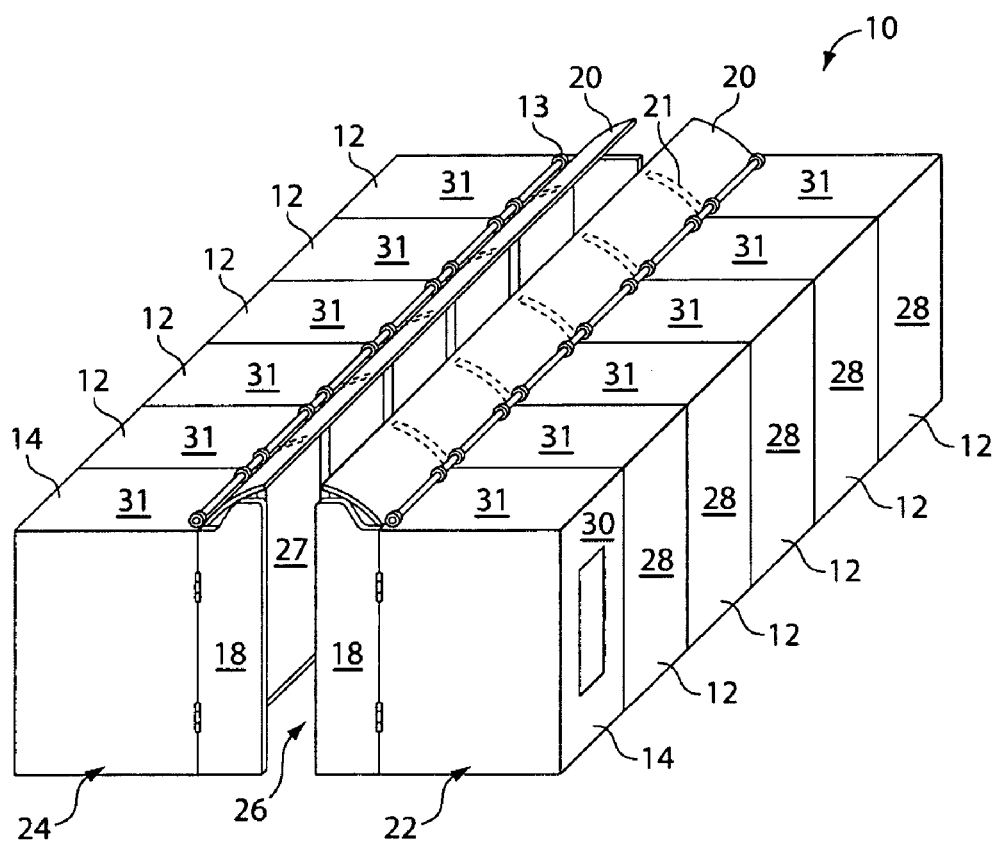
FIG. 1 is a perspective view of a data center having a cooling unit for cooling rack mounted equipment.

Referring to FIG. 1, a data center 10 includes a room and rows of equipment racks in the room. For purposes of illustration, the data center 10 is shown having two rows of equipment racks or cabinets. The data center 10 includes equipment racks 12, cooling units 14, lower restriction panels 18 and upper restriction panels 20 providing a cold aisle 26. The cold aisle 26 is formed by the equipment racks 12 and/or the cooling units 14 positioned adjacent to each other to form a row 22 and a row 24. The rows 22 and 24 are preferably substantially parallel. The cooling units 14 are preferably positioned adjacent to the equipment racks 12 in the rows 22 and 24, respectively. The cold aisle 26 is located between the row 22 and the row 24.

Each equipment rack 12 includes a front side 27 and a back side 28. Likewise, each cooling unit 14 includes a front side 29 (shown in FIGS. 2 and 3A) and a back side 30. The front side 27 of each of the equipment racks 12 and the front side 29 of each of the cooling units 14 faces the cold aisle 26. The front sides 27 of the racks 12 in the row 22 face the front sides 27 of the racks in the row 24. The back sides 28 of the equipment racks 12 and the back sides 30 of the cooling units 14 face the surrounding room of the data center 10, or the back sides 28, 30 face the backs of other rows or equipment racks in the hot aisle/cold aisle configuration of the data center 10.

In FIG. 1, each of the rows 22 and 24 comprise five equipment racks. In embodiments of the invention, the number of racks and the function of the equipment in the racks can vary. For example, in addition to containing electronic equipment, the equipment racks 12 may comprise a power distribution unit or a power protection unit, each of which may provide power to the racks 12 in the rows 22 and 24. The racks 12 are preferably, but not necessarily, standard 19 inch racks, such as those available from American Power Conversion Corporation of West Kingston, R.I., under the trade name NETSHELTER VX Enclosures®. The number of rows can vary. For example, one row comprising one or more cooling units and one or more equipment racks can be placed in a room. Another example could include 3, 4, 5 or more rows, each row comprising one or more cooling units and one or more equipment racks placed in the room.

The lower restriction panels 18 are positioned at the end of the cold aisle 26 spanning at least a portion of the area between the rows 22 and 24. The cold aisle 26 is accessible by the lower restriction panels 18. Preferably, the lower restriction panels 18 are configured (e.g., hinged) to swing open and shut and are located at each end of the cold aisle 26. The lower restriction panels 18 can have hinges that are spring-loaded to return to a closed position after opening. Alternatively, an end of the cold aisle 26 is otherwise blocked off by a door, a wall, or by other means. The lower restriction panels 18 act to restrict mixing of cool air in the cold aisle 26 with warm air in the surrounding data center 10. The lower restriction panels 18 also allow quick access and regress from the cold aisle 26 between the rows 22 and 24. The panels may not join and may be separated to allow viewing into the cold aisle 26 and down the rack rows 22 and 24. The lower restriction panels 18 are optional, but are preferably included at the ends of the cold aisle 26, providing increased efficiency to the cooling process. The lower restriction panels 18 can be positioned at other locations in the cold aisle 26.

The upper restriction panels 20 extend from top portions 31 of the equipment racks 12 and the cooling units 14. The upper restriction panels 20 extend toward one another over the cold aisle 26. The upper restriction panels 20 are detachably coupled to the top portions 31 of the racks 12, e.g., via a post-and-hole configuration. For example, the equipment racks 12 can be configured to have at least one attachment aperture 13 in a top surface to receive a pole 21 that supports the top panel 20. Preferably, the upper restriction panels 20 are a substantial distance from the ceiling tiles and do not interfere with sprinkler systems and lighting of the data center 10. The upper restriction panels 20 are preferably a solid sheet steel. Alternatively, the upper restriction panels 20 are constructed of a translucent and porous material such that light in the data center 10 passes through the panels 20 and illuminates the cold aisle 26. Other materials are possible and envisioned, such as plexiglass, semi-transparent plexiglass, cloth, such as a mesh shade, or plastic.

The upper restriction panels 20 extending from the racks 12 on one side of the cold aisle 26 preferably do not touch or connect with the upper restriction panels 20 on the opposing side of the cold aisle 26. The upper restriction panels 20 are positioned to allow a space for water to enter the cold aisle 26, or configured of a material that allows water to pass through into the cold aisle 26, such as water from a sprinkler system in the data center 10. As with the lower restriction panels 18, the upper restriction panels 20 are optional. The upper restriction panels 20 assist in increased separation between the cold aisle 26 and the exhaust or surrounding ambient air.

Figure 2:
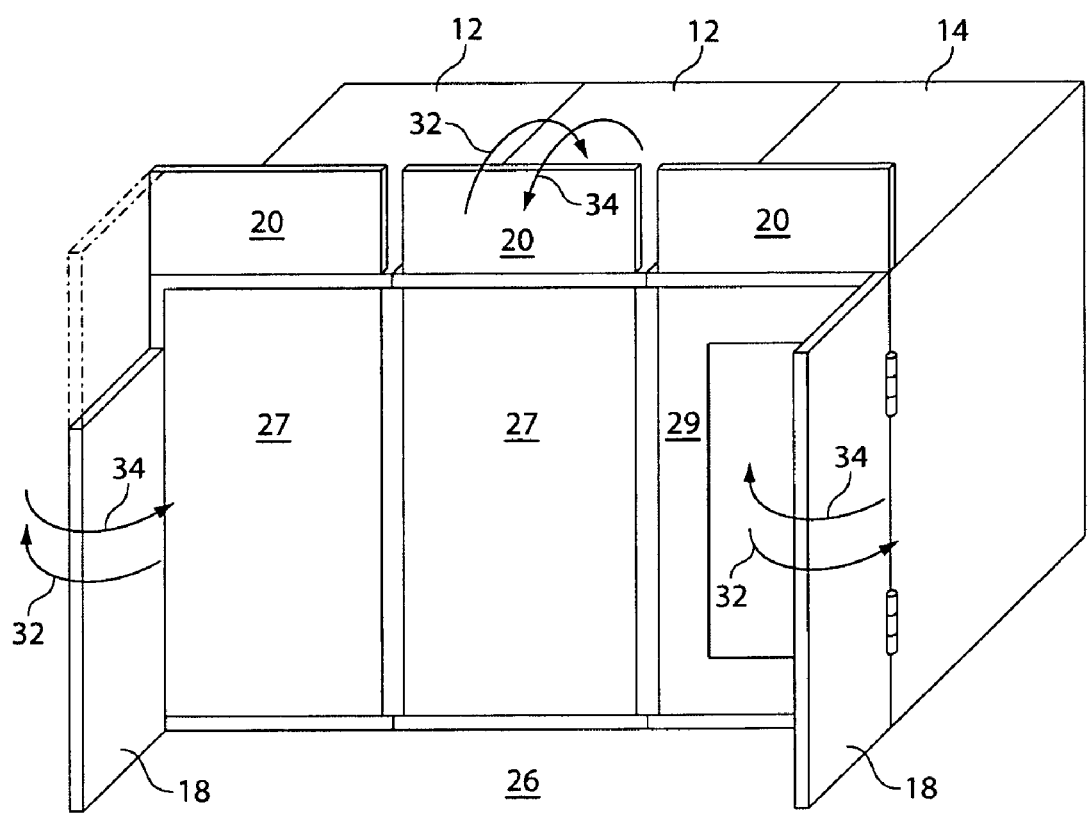
FIG. 2 is a front perspective view of a row in the data center of FIG. 1.

With like numbers referring to like elements, referring to FIG. 2, the upper restriction panels 20 and lower restriction panels 18 hinder mixing of the cold air with warm air in the surrounding room. The upper restriction panels 20 create a substantially lengthy flow path by which cold air exits the cold aisle 26, and by which hot air enters the cold aisle 26. The cooling unit 14 releases cooled air into the cold aisle 26. The upper restriction panels 20 and the lower restriction panels 18 assist in retaining the cool air in the cold aisle 26. To exit the cold aisle 26, the cooled air leaves the cooling unit 14 and is forced to travel around the edge of the lower restriction panels 18, as represented by arrows 32. The cold air is also forced to travel over the edge of the upper restriction panels 20, which increases the difficulty by which the cold air leaves the cold aisle, shown by arrow 32. In a parallel manner, warm air travels over a longer flow path in order to enter the cold aisle 26 from a position outside of the cold aisle, as shown by arrows 34. As shown in FIG. 2, the lower restriction panels 18 can extend to the height of, or above the height of, the cooling unit/rack. Lower restriction panels 18 can be used without upper restriction panels 20. Likewise, upper restriction panels 20 can be used without lower restriction panels 18.

The cooling units 14 are modular units movably positioned in the rows 22 and 24. In FIG. 1, a single cooling unit 14 is positioned in each of the rows 22 and 24. The number of cooling units 14 positioned in each row 22, 24 may vary. Also, the position of the cooling units 14 within the rows 22 and 24 may vary.

The cooling units 14 provide cooled air to equipment in the racks 12. The cooling units 14 can use a building chilled liquid supply to cool the air. The building chilled liquid supply comes into a manifold 124 (shown in FIG. 8) which is located separate from the cooling unit 14 and is distributed by multiple cooling lines to one or more cooling units 14 in the rack rows 22 and 24. Alternatively, the cooling units 14 can provide heat removal using a direct expansion refrigerant-based heat exchanger, which can be in the cooling unit itself or separate from the cooling unit 14. The cooling units 14 can be configured for air, water or glycol use. The cooling unit 14 preferably has substantially the dimensions of an individual equipment rack 12. The cooling unit 14 can alternatively be wider, narrower, taller or shorter than the equipment racks 12. Multiple cooling units 14 can be positioned adjacent to one another in a row and configured to operate together by moving air in the same direction into the cold aisle 26 or by directing air in opposite directions into the cold aisle 26 (e.g., racks 12 are on either side of the cooling units 14). The cooling units can include monitoring devices for monitoring the volumetric flow rate of cool air released from the cooling units 14.

Figure 3A:
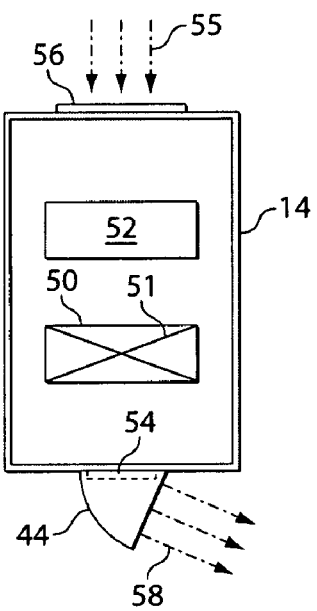
FIG. 3A is a top perspective cutaway view of the internal portions of a cooling unit used in the data center of FIG. 1.
Figure 3B:
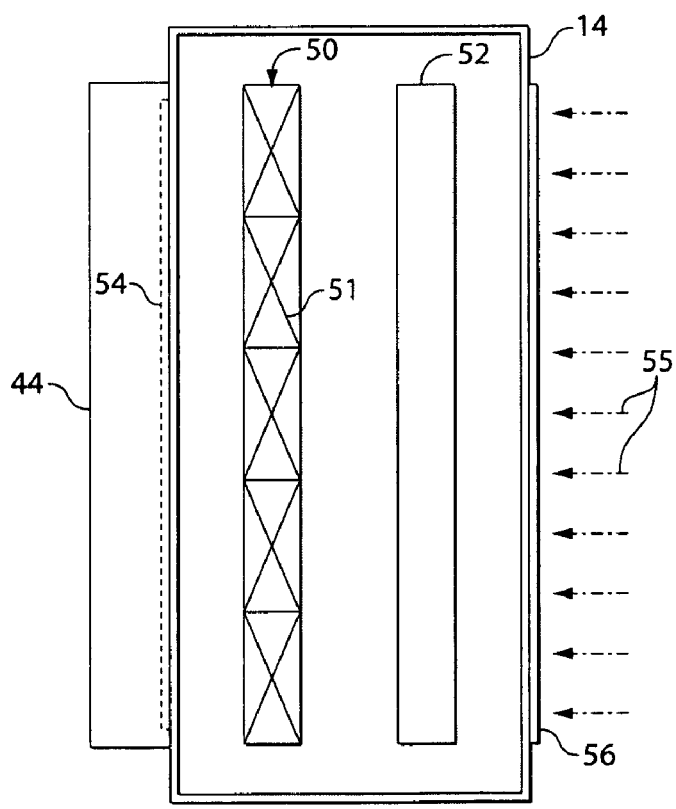
FIG. 3B is a side perspective cutaway view of a cooling unit used in the data center of FIG. 1.

As discussed above with respect to FIG. 1, the cooling unit 14 provides cooled air to the equipment racks 12. Referring to FIGS. 3A and 3B, the cooling unit is shown with the top removed to reveal internal components as well as external components. The cooling unit 14 includes a turning member 44, a fan bank 50, a heat exchanger 52, a cold air supply port 54 and a return port 56. The fan bank 50 can be a series of fans stacked one atop the other. Alternatively, the fan bank 50 is a single fan. The heat exchanger 52 cools air as it enters the cooling unit 14. The return port 56 is positioned on a back face of the cooling unit 14. The cold air supply port 54 is positioned on a front face of the cooling unit. The cold air supply port 54 can be positioned adjacent to the turning member 44, or substantially beneath the position of the turning member 44. Air entering the return port 56 in the direction of arrow 55 is generally supply air that is room temperature or greater than room temperature. Air enters the return port 56 and passes through the heat exchanger 52, which cools the air. As the air passes through the heat exchanger 52, the fans 51 in the fan bank 50 pull the air through the fans 51. The fans 51 distribute the air as the air is pushed toward the cold air supply port 54. Cold air is released through the cold air supply port 54 and directed by the turning member 44 toward the cold aisle or toward the equipment racks of the data center, in the direction of arrow 58. Alternatively, the fan 51 can pull in the air entering the return port 56 and push the air through the heat exchanger 52.

Figure 3C:
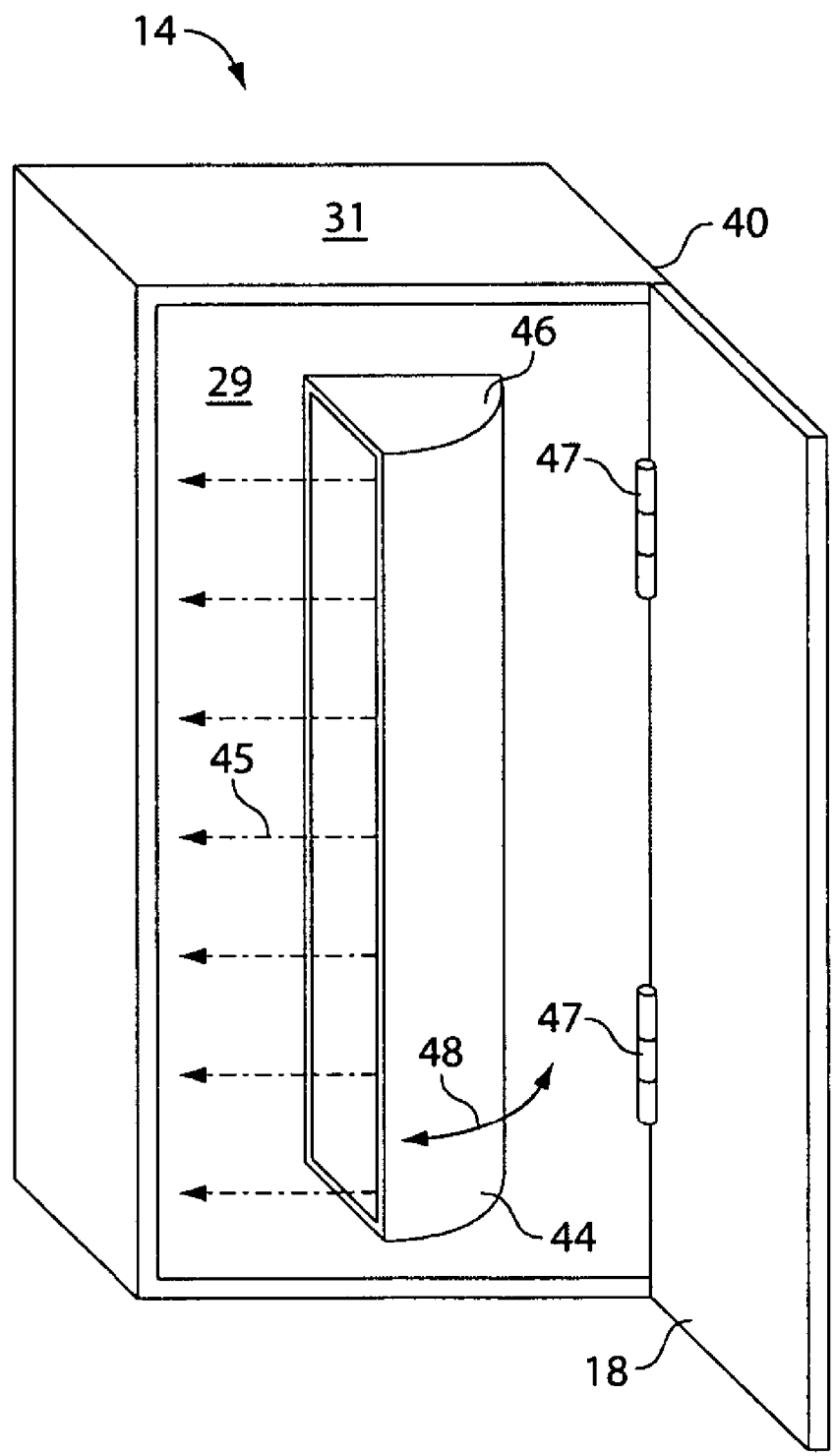
FIG. 3C is a front perspective view of a cooling unit used in the data center of FIG. 1.

Referring to FIG. 3C, the cooling unit 14 includes a housing 40, the air directional member or turning member 44, and the lower restriction panel 18. The turning member 44 includes end caps 46. The turning member 44 is coupled to the front face 29 of the cooling unit 14. The turning member 44 can be removably connected to the front face 29 of the cooling unit 14. The turning member 44 is reversible, i.e., the turning member can be pivoted or moved to expel air to the left or right of the cooling unit 14. The turning member 44 extends a substantial portion of the height of the cooling unit 14 and directs air exiting the cooling unit 14. Air exiting the cooling unit 14 is funneled into and expelled through the turning member 44. The air is directed by the turning member 44 in the direction of arrows 45. The turning member 44 can connect to the cooling unit 14 without tools. The turning member 44 is adjustable and removable. For example, the turning member 44 is expandable and retractable in the direction of arrow 48. Further, the release aperture of the turning member 44, i.e., the size of the discharge area of the turning member 44, can be changed or adjusted.

The turning member 44 is positioned to direct the cool air from left to right or from right to left, depending on the position of the equipment racks 12 with respect to the cooling unit 14. End caps 46 substantially prevent airflow in downward and upward directions. Air is released from the cooling unit 14 to produce a horizontal air stream of cold air. Cold air is released for cooling along substantially the height of the equipment racks 12.

Figure 4A:
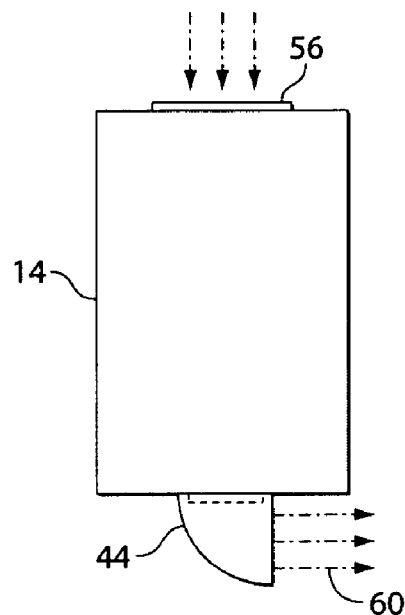
FIGS. 4A-4D are top perspective views of a cooling unit having portions of the cooling unit adjusted to different positions.
Figure 4B:
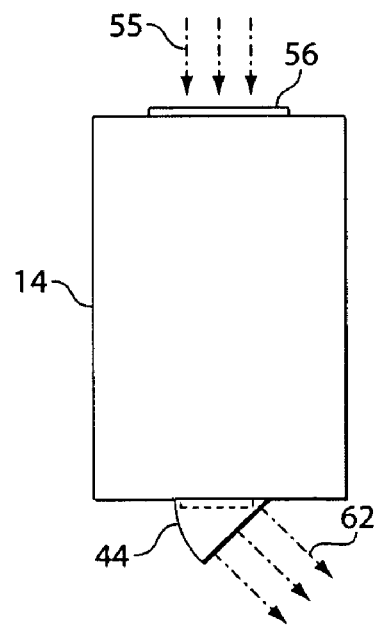
Figure 4C:
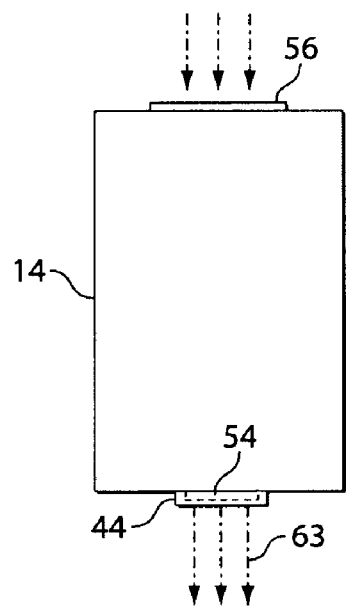

The turning member 44 is preferably fixed in position to direct air at a particular angle. Alternatively, referring to FIGS. 4A-4D, the turning member 44 is expandable and retractable such that the turning member 44 can be adjusted to direct air at different angles with respect to the front face of the equipment racks 12. Referring to FIG. 4A, a top view of the cooling unit 14 is shown with the turning member 44 in a fully extended, or 90-degree position. In this position, the turning member 44 directs air in the direction of arrow 60 across the front face 27 of the equipment racks 12 proximal to the cooling unit 14. Referring to FIG. 4B, the cool air is preferably delivered to the racks 12 at approximately a 45-degree angle with respect to the racks 12 such that the cool air gently fills the cold aisle 26 as it moves the cool air horizontally down the row of racks, and can be efficiently drawn into the racks. By delivering the cool air at an angle, shown by arrow 62, pressure disturbances experienced by racks closest to the cooling unit 14 is minimized. Referring to FIG. 4C, the turning member 44 can be adjusted to a fully retracted, or 0-degree position, to direct air substantially straight into the cold aisle 26, shown by arrow 63. The turning member 44 can be positioned at other angles as desired. For example, the turning member 44 can be positioned at any of a number of angles between 0 degrees and 90 degrees, and at angles exceeding 90 degrees, and the angle of release of the cooled air can be modified to suit the needs of the racks 12 in the rows.

Figure 4D:
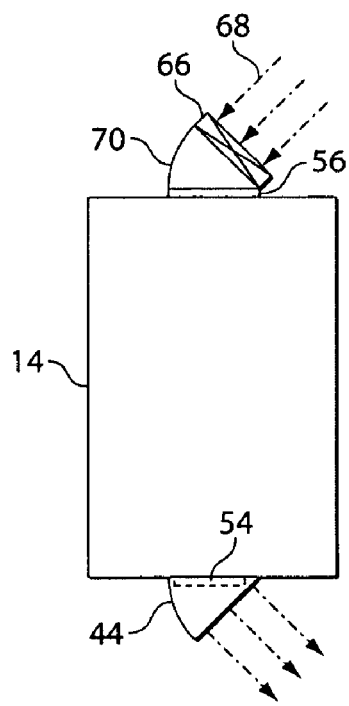

Referring to FIG. 4D, a rear turning member 70 can be positioned on the rear face of the cooling unit 14 to assist in the air return process. Air released from the racks 12 can be pulled into the rear turning member 70 via a fan 66. The volumetric air flow into the cooling unit 14 is increased by the fan 66 and rear turning member 70. The rear turning member 70 can be adjusted to any of a number of angles, such as at a 0-degree angle, a 45-degree angle, or a 90-degree angle to draw air into the cooling unit 14.

Figure 5A:
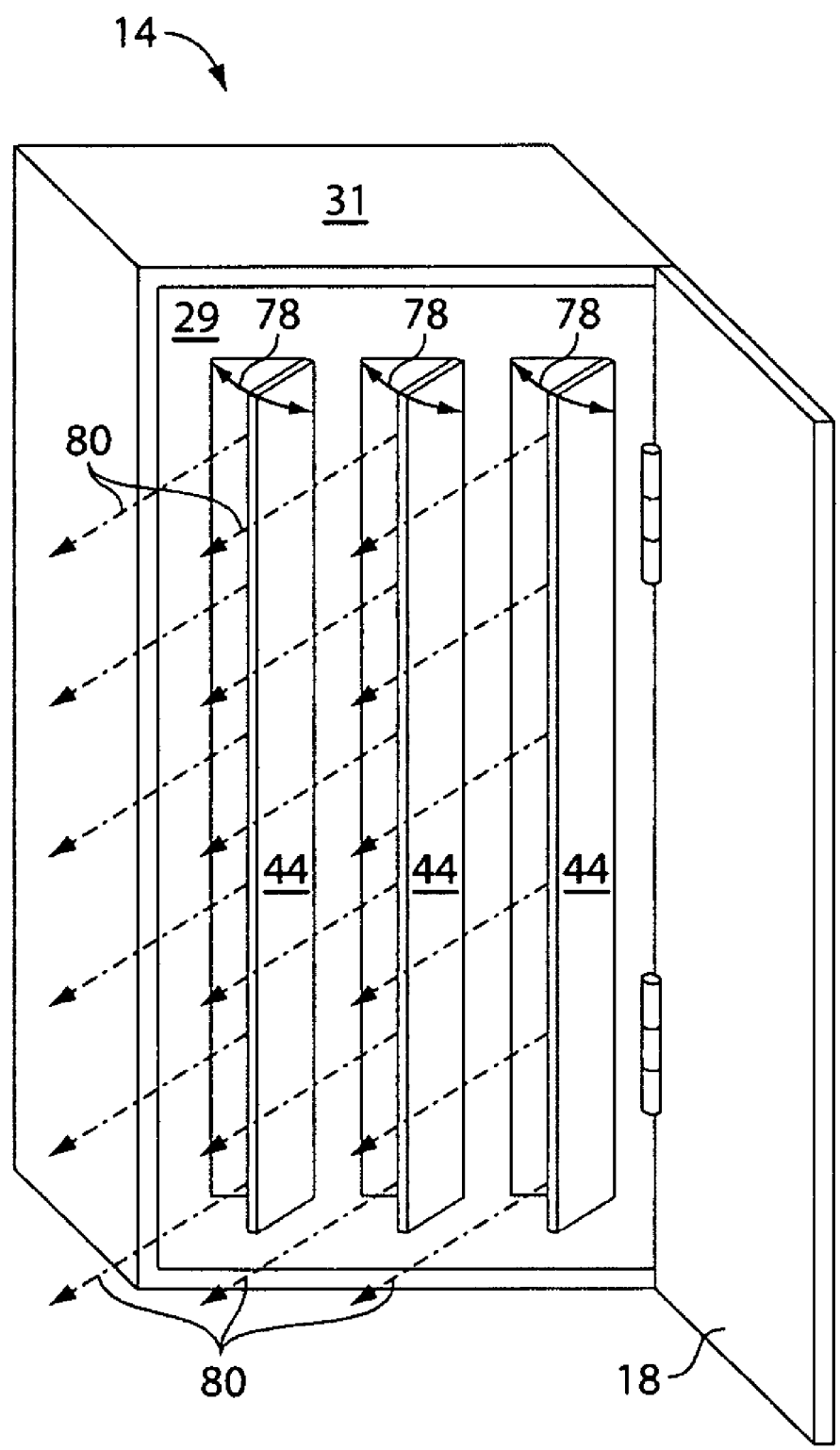
FIG. 5A is a front perspective view of an alternate cooling unit used in the data center of FIG. 1.

Numerous designs of the turning member 44 can be integrated into the cooling unit 14 as shown in FIGS. 5A-5H. In FIG. 5A, an alternative cooling unit 14 includes a plurality of turning members 44. The turning members 44 attach to the front face of the cooling unit 14. The turning members 44 can attach with hinges or by any of a number of known attachment means. Each of the plurality of turning members 44 moves independently of the remaining turning members 44. The turning members 44 are adjustable in the direction of arrows 78. Further, the turning members 44 can each be adjusted to direct air to the left of the cooling unit 14 or to the right of the cooling unit 14. In FIG. 4A, the turning members 44 are each positioned to move air in the same direction, indicated by arrows 80. The turning members 44 can be attached to the cooling unit 14 without end caps 46.

Figure 5B:
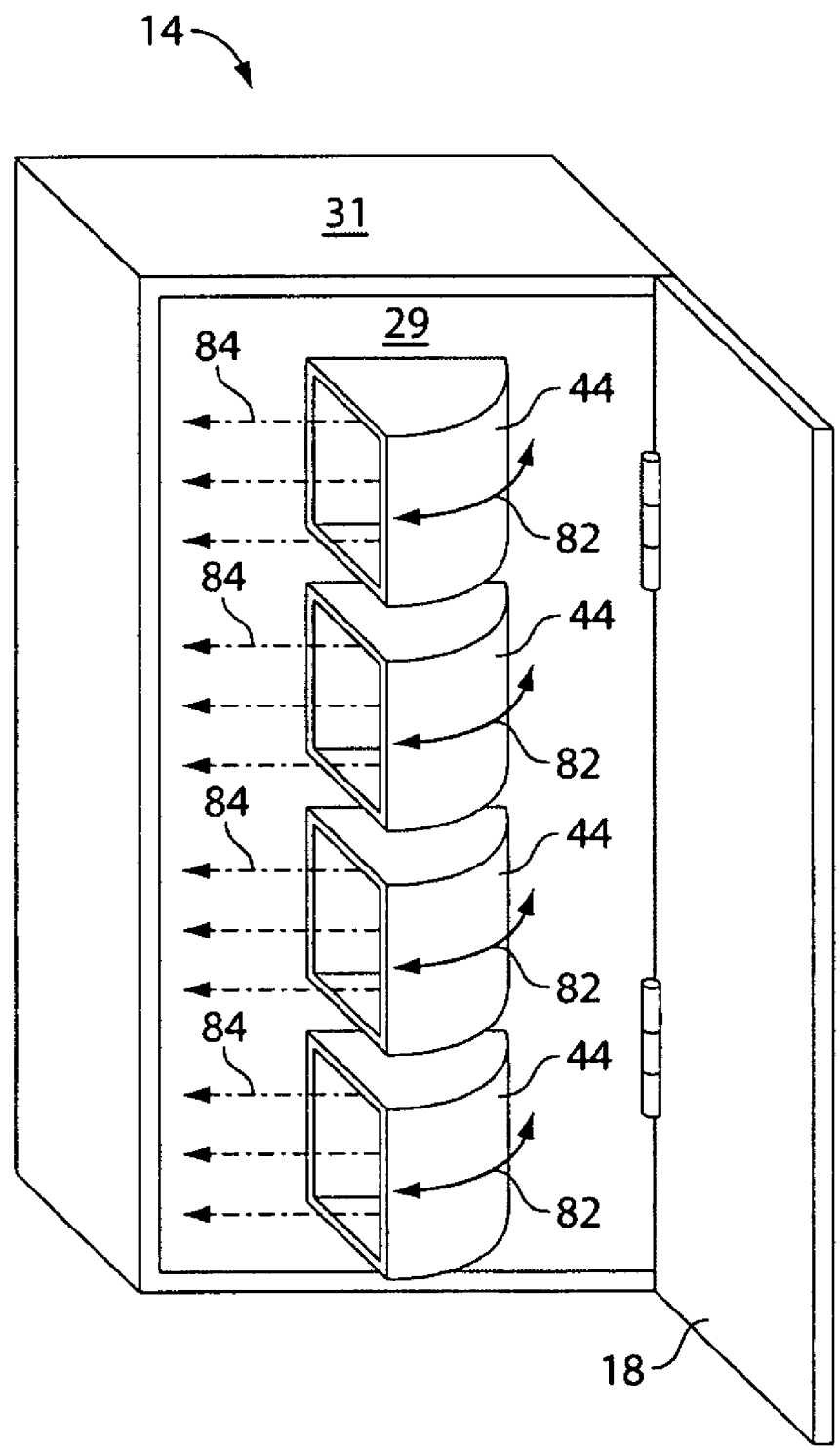
FIG. 5B is a front perspective view of an alternate cooling unit used in the data center of FIG. 1.

FIG. 5B provides a cooling unit having a plurality of turning members 44 positioned one above the other along the height of the front face 29 of the cooling unit 14. In the alternative in FIG. 5B, the turning members 44 are independently movable and adjustable to different positions by moving in the direction of arrows 82. The turning members 44 allow cool air released out of the cooling unit 14 to be directed in a first direction at the top of the cooling unit 14 while cool air released from the middle and bottom can be directed in a different direction, or in numerous different directions. The turning members 44 along the height of the cooling unit 14 can be adjusted to allow more or less volume of air to a particular rack height. As shown, air exiting the cooling unit 14 moves in the direction of arrows 84.

Figure 5C:
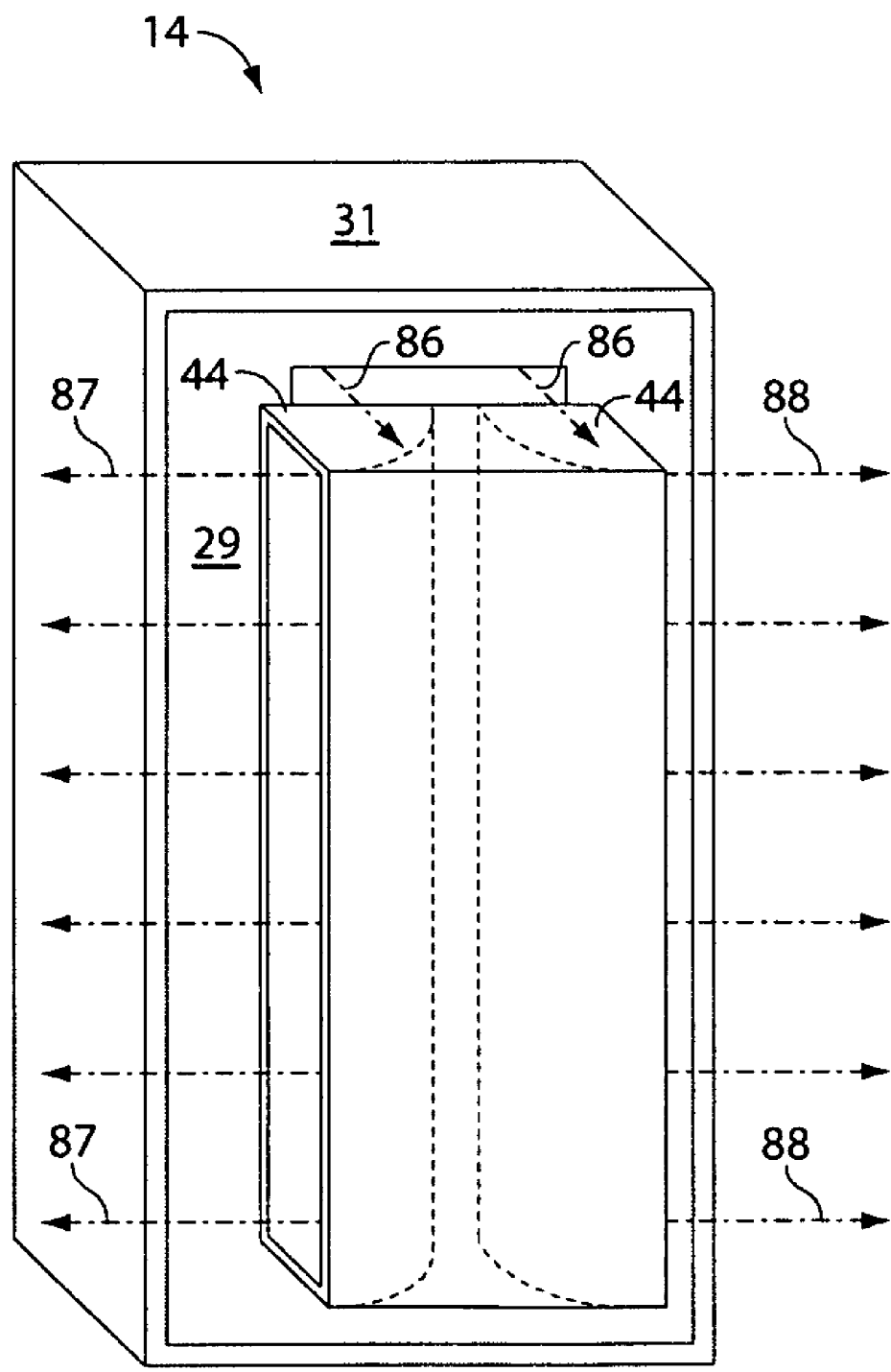
FIG. 5C is a front perspective view of an alternate cooling unit used in the data center of FIG. 1.

Referring to FIG. 5C, an alternative cooling unit 14 having turning members 44 is shown releasing air to both the left and the right of the cooling unit 14. The turning members 44 have a length that is substantially the length of the cooling unit 14. Air exiting the cooling unit 14 in the direction of arrows 86 is split to turn either to the left, shown by arrow 87, or to the right, shown by arrows 88 via one of the turning members 44. The turning members 44 can be adjusted independently of each other to release air released to the left 87 at a different angle, or many different angles, than air released to the right 88.

Figure 5D:
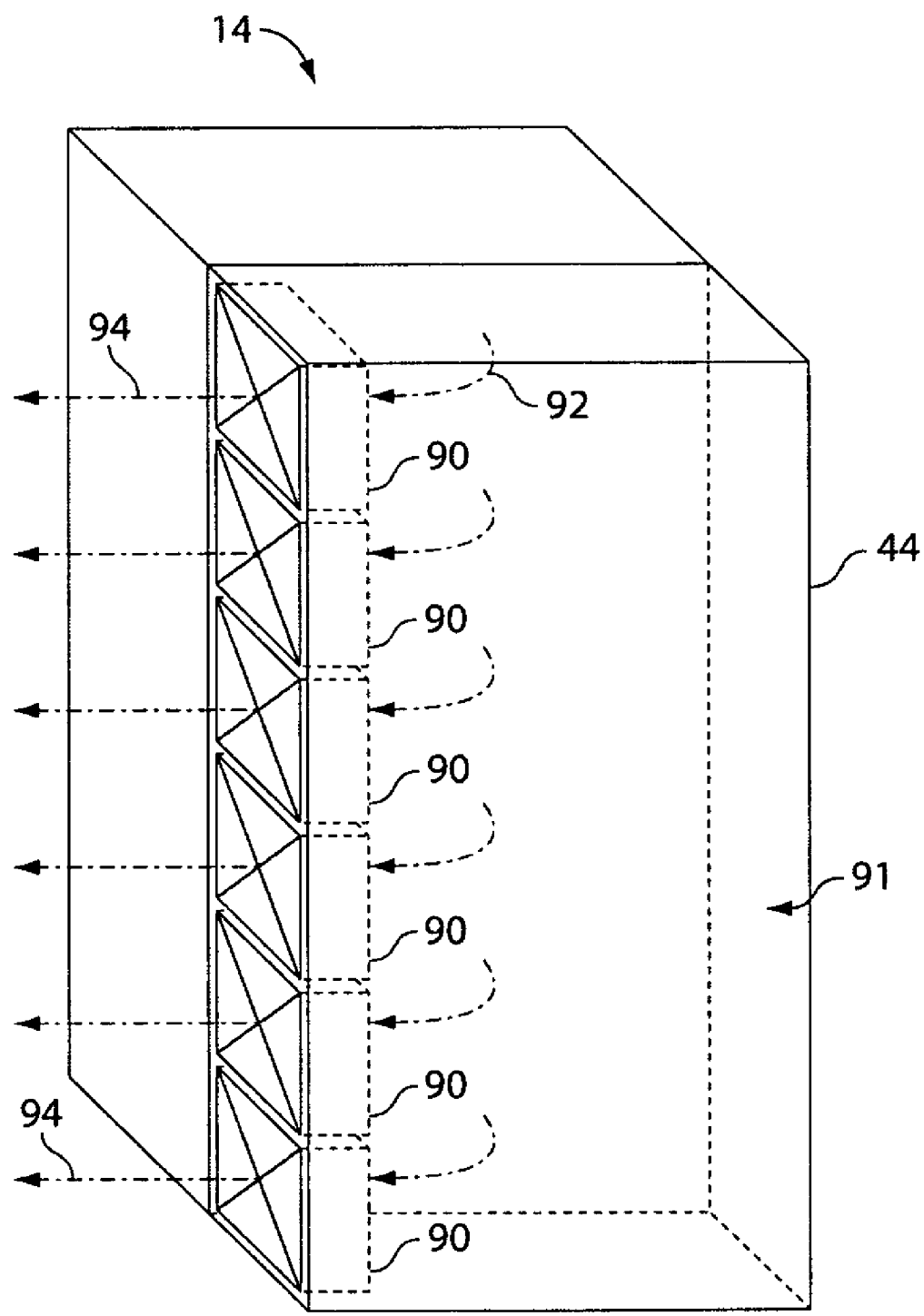
FIG. 5D is a front perspective view of an alternate cooling unit used in the data center of FIG. 1.

In FIG. 5D, the turning member 44 is positioned over the front face of the cooling unit and includes fans 90. The turning member 44 increases the footprint of the cooling unit 14. The turning member 44 includes a hollow portion 91 that collects the air before the air is pulled through the fans 90. Air released from the cooling unit in the direction of arrows 92 is re-directed by the fans 90 positioned along the height of the turning member 44 to push air in the direction of arrows 94. The fans 90 can each be positioned to direct air at the same angle and flow velocities as the remaining fans 90. The fans 90 can be positioned at differing angles with respect to one another to direct the air into the cold aisle or toward the racks 12 at different angles and with different flow velocities. The adjustability of the fans 90 allows cooling control to be altered depending on the racks, i.e., the number of racks, the heat produced by the racks, etc.

Figure 5E:
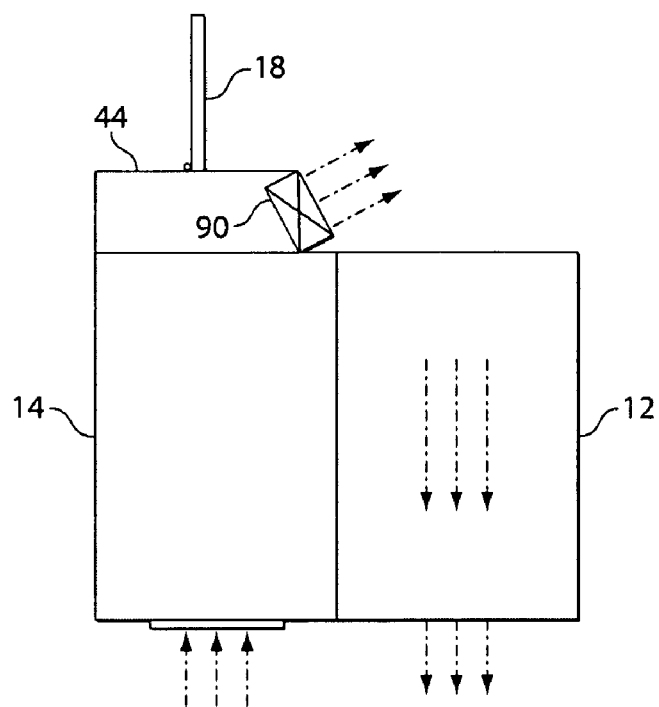
FIGS. 5E and 5F are top perspective views of cooling units having a turning member.
Figure 5F:
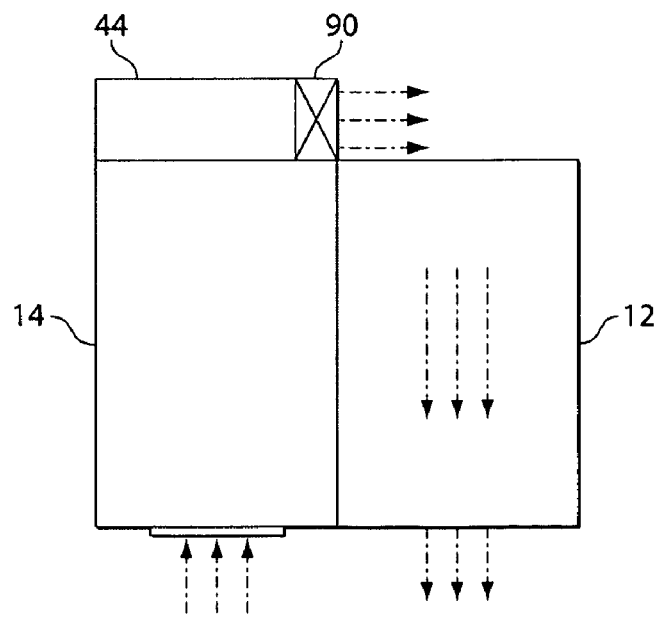

As shown by top perspective in FIGS. 5E and 5F, the cooling unit of FIG. 5D can have a larger footprint than the rack 12. The turning member 44 extends from a front portion of the cooling unit 14 to expel air at an angle, FIG. 5E, or at 90-degrees or perpendicular to the rack 12, FIG. 5F, for example.

Figure 5G:
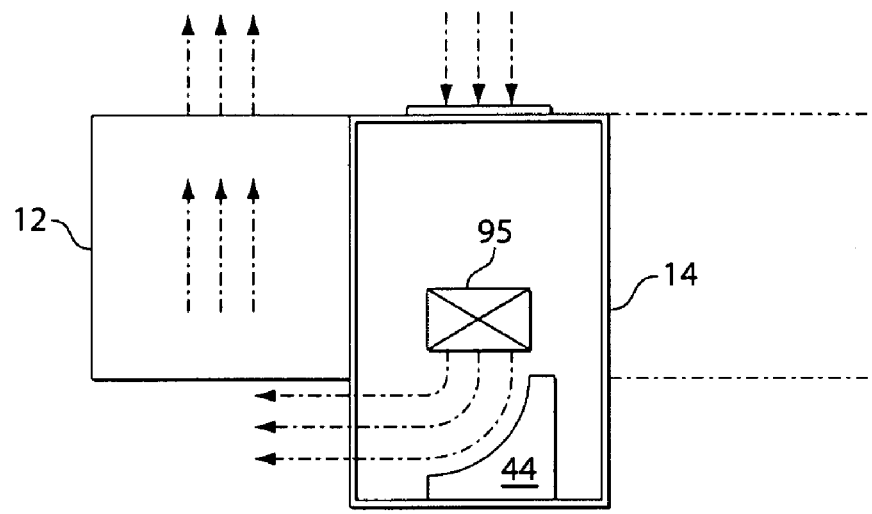
FIGS. 5G and 5H are top perspective views of cooling units having a turning member.
Figure 5H:
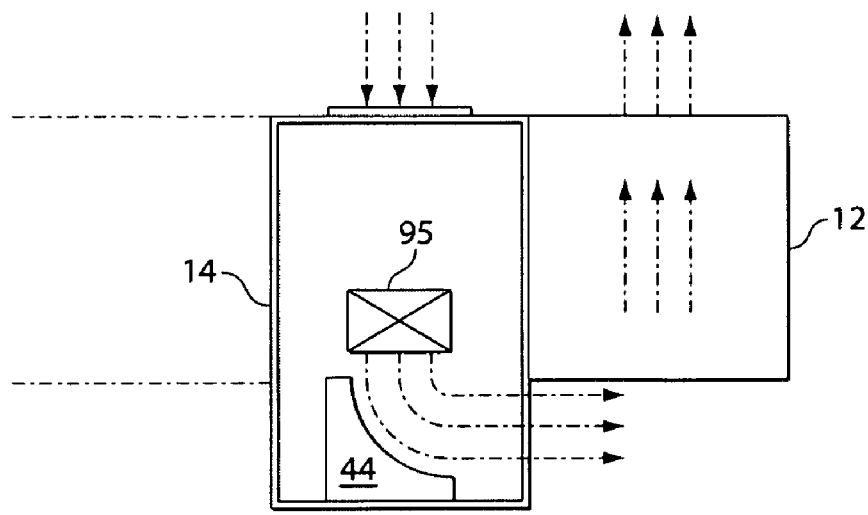

The cooling unit 14 in FIGS. 5G and 5H includes the turning member 44 in the form of a reversible air flow diverter. The footprint of the cooling unit 14 is greater than the footprint of adjacent racks 12. Air is moved through the cooling unit 14 with a fan 95. The turning member 44 is positioned in the housing for the cooling unit 14. The fan 95 pushes the air toward the turning member 44, where the air exits the cooling unit 14. In FIG. 5G, the air exits the cooling unit 14 to the left to cool a rack positioned to the left of the cooling unit. In FIG. 5H, the air exits the cooling unit 14 to the right to cool a rack positioned to the right of the cooling unit 14. Racks can be positioned or repositioned with respect to the cooling unit 14, and the turning member 44 can be adjusted to accommodate the changes to the positioning of the racks 12.

In each of the cooling units 14 of FIGS. 3A-5H, the turning member 44 can be adjusted manually or automatically to deliver various volumes of air to particular locations. For example, measuring the current to one or more locations along the height of the equipment racks provides the power draw, or load, of the equipment in a particular location of the rack. The power draw information in conjunction with temperature measurements can be used to adjust the volume of air from one or more cooling units 14 to a particular rack or a portion of a particular rack. In addition, or alternatively, the exhaust temperature of the intake air can provide information to the cooling units 14 to allow for adjustment of one or more turning members 44. Flow rate can be adjusted based on any one or combination of three parameters: the power load, the airflow, and/or the temperature rise through the rack. These measurements can be taken with respect to a single rack, or these measurements can be taken for a row of racks and aggregated. Information collected is sent to a cooling control system which can make adjustments, for example, by altering the fan speed of fans in the racks.

Figure 6A:
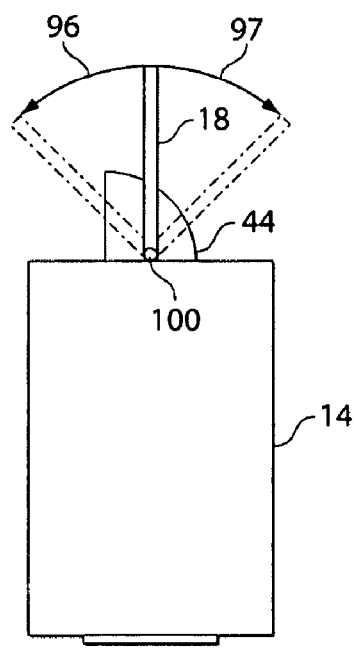
FIG. 6A is a top perspective of a cooling unit having a restriction panel attached thereto.
Figure 6B:
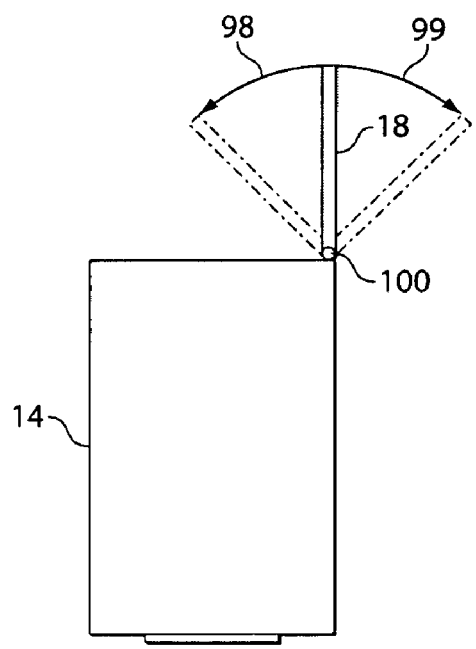
FIG. 6B is a top perspective of a cooling unit having a restriction panel attached thereto.
Figure 6C:
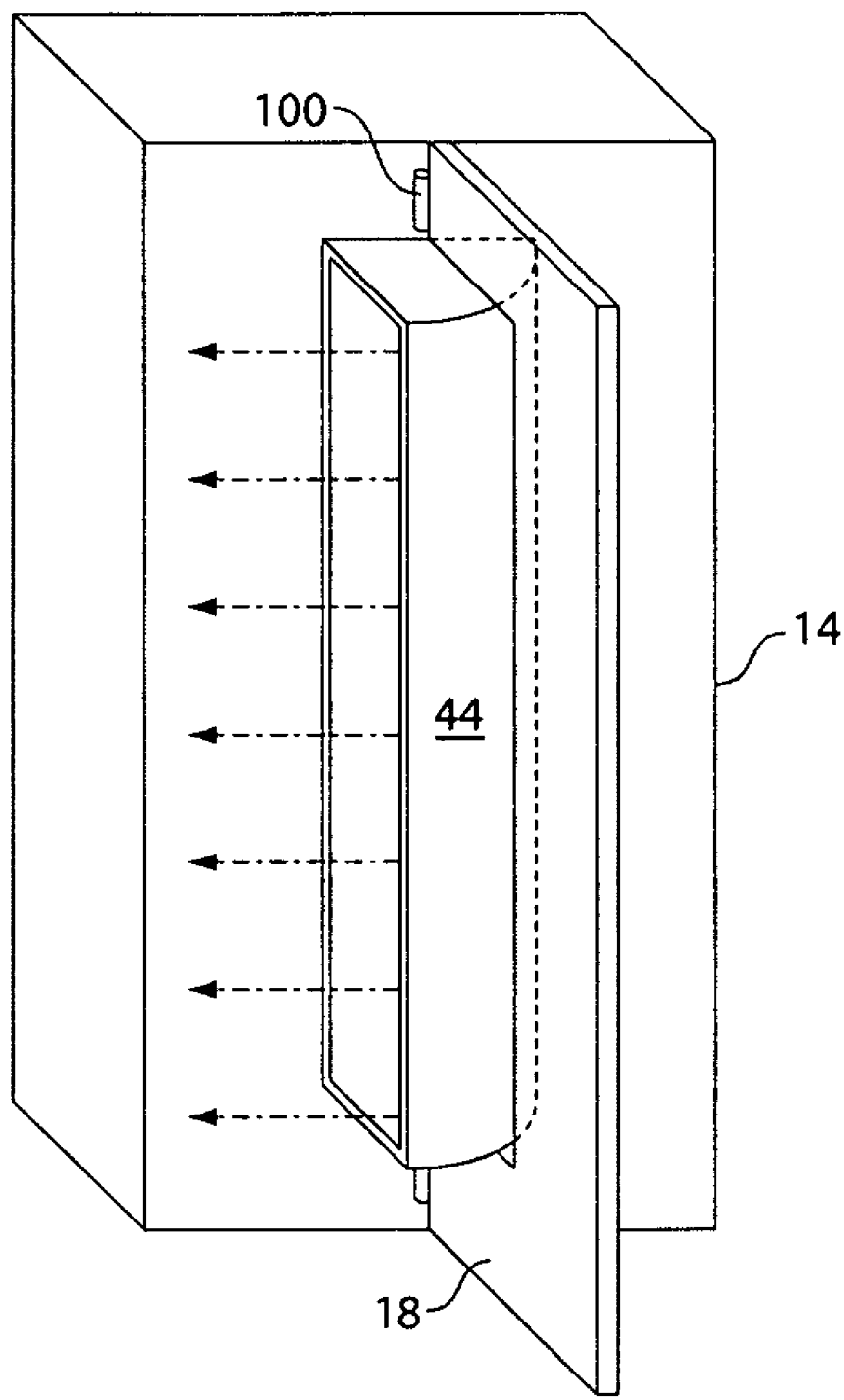
FIG. 6C is a side perspective view of a cooling unit having a restriction panel attached to a portion of the cooling unit.

Referring to FIGS. 6A and 6B, the lower restriction panel 18 can be attached in a number of positions on the cooling rack 14, and can be positioned in conjunction with the turning members 44. FIG. 6A, a cooling rack 14 includes the lower restriction panel positioned over the turning member 44. The lower restriction panel 18 is movable about pivot 100 in the direction of arrows 96 and 97. As shown in FIG. 6C, the pivot 100 can be hinges connecting the lower restriction panel 18 to the front face of the cooling unit 14. In FIG. 6B, the lower restriction panel 18 is positioned on an edge of the cooling unit 14. The lower restriction panel is movable about pivot 100 in the direction of arrows 98 and 99. The lower restriction panel 18 can be attached to a rack 12, and more than one lower restriction panel 18 can be positioned in a row of racks 12 and cooling units 14.

Figure 7:
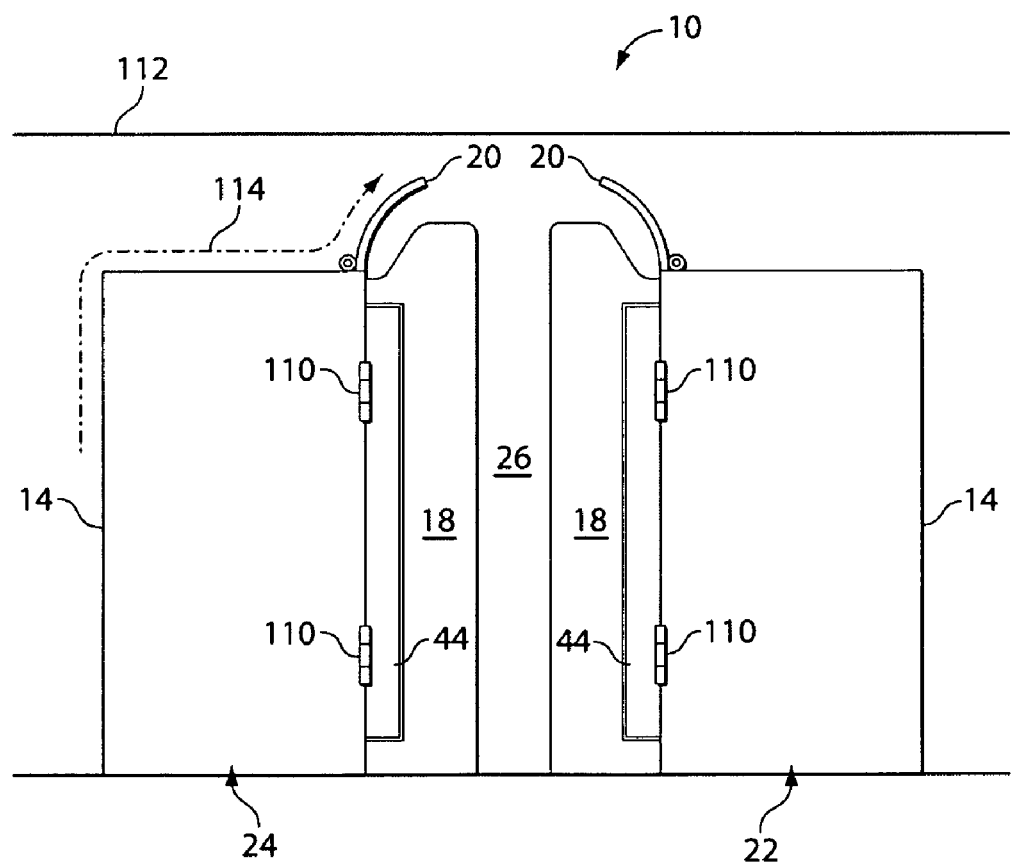
FIG. 7 is a side view of the data center of FIG. 1.

Referring to FIG. 7, the data center 10 having the cooling units 14, lower restriction panels 18, and upper restriction panels 20 is configured to create a substantially lengthy and resistive path between hot air exhaust from the equipment and cool air being delivered by the cooling unit 14. The lower restriction panels 18 extend above and below, and are coupled to the cooling unit 14 above and below, the turning member 44. In other words, the lower restriction panels 18 couple to the cooling units 14 in a position straddling the turning members 44. Alternatively, the lower restriction panels 18 can attach to the cooling units 14 without coupling to the turning member 44. The turning members 44 and the lower restriction panels 18 help restrict mixing of the cool air in the cold aisle 26 and the surrounding air in the data center 10. The lower restriction panels 18 can be coupled to the cooling units 14 or to the racks 12 positioned in the rows 22 and 24 via hinges 110. Other coupling means are possible and envisioned. Preferably, the lower restriction panels 18 do not span the distance between the row 22 and the row 24 so that the cold aisle 26 is visible and accessibility from the surrounding room to the data center 10 is achieved by the lower restriction panels 18.

As also shown in FIG. 7, the top of the cold aisle 26 is exposed to a ceiling 112 due to the opening between upper restriction panels 20 mounted on each side of the cold aisle 26. Lights, sprinkler systems, or other systems, such as security systems that are mounted in the data center 10 are effective as to the cold aisle 26 with substantially no adjustment or reconfiguration of the data center 10 infrastructure, i.e., the room surrounding the rows of racks remains substantially the same, even if racks or cooling units are added to the rows. The upper restriction panels 20 can vary in height to accommodate the ceiling 112 height of the data center 10. Panels 20 of differing heights can be used in a row of racks. The arrangement and number of racks 12 in the rows 22 and 24 may be changed as desired without redesigning the existing sprinkler system, lighting, or raised floor, as well as other features of the data center. For example, sprinklers and lighting may remain unaltered each time a cooling unit 14 or rack 12 is added or removed from a row. As shown by arrow 114, the upper restriction panels 20 substantially restrict return air from mixing with the air in the cold aisle 26.

Figure 8:
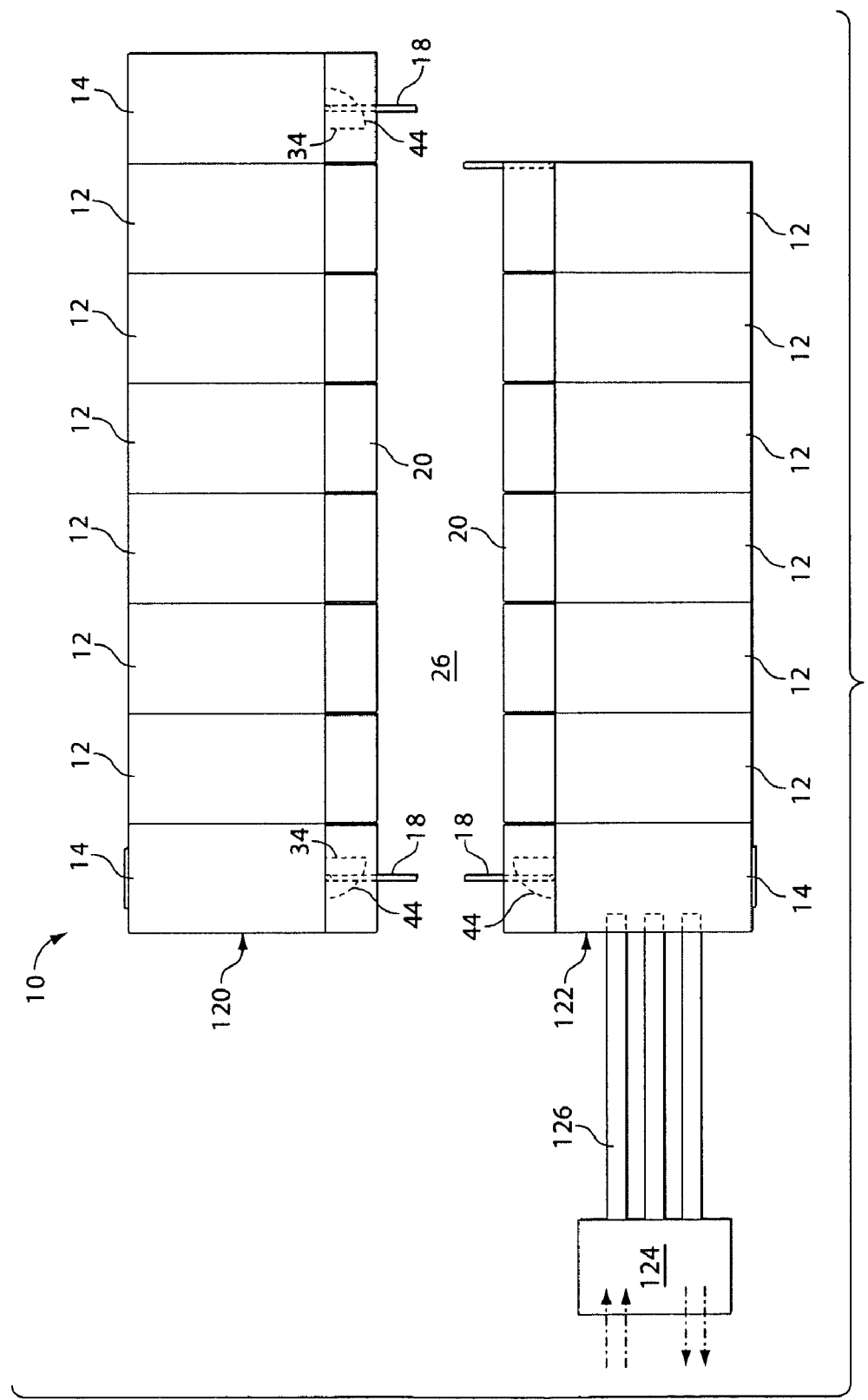
FIG. 8 is a top view of a data center cooling system for rack-mounted equipment.

Referring to FIG. 8, a data center 10 is similar to the data center 10 of FIG. 1, but includes a different number of equipment racks 12 and a different number of cooling units 14 in each of the rows 120 and 122. A cold aisle 26 is provided by the arrangement of the equipment racks 12, the cooling units 14, the lower restriction panels 18, and the turning members 44. A manifold 124 is connected to one or more of the cooling units 14 via flexible fluid lines 152. Alternatively, the manifold 124 is connected to at least one of the cooling units 14 via rigid fluid lines. The manifold 124 provides cooling fluid, e.g., water, to multiple lines 126 for use by the cooling units 14. The rows 120 and 122 are substantially parallel and include the racks 12 and the cooling units 14 that face one another as shown.

In FIG. 8, a cooling unit 14 is positioned at one end of the row 120 and a cooling unit 14 is positioned at each of the ends of the row 122. To accomplish cooling of equipment contained in the racks 12, the cooling units 14 are positioned to expel cooled air along substantially the height of the racks 12. The turning members 44 in each of the cooling units 14 are directed such that air flowing out of the cooling units is directed through the turning member 44 toward the equipment racks 12. The cool air moves horizontally down the cold aisle 26. The equipment racks 12 draw in the cool air into the racks along substantially the height of the racks 12 to cool equipment in the racks 12. Equipment at the top of the racks 12 draws air at the same temperature as equipment at the middle or bottom of the rack 12. The turning members 44, the lower restriction panels 18, and the upper restriction panels 20 substantially restrict mixing of the cool air released from the cooling unit 14 with the warm air from the equipment exhaust of the data center 10.

In FIG. 8, two or more cooling units 14 provide redundant cooling to the data center 10. If one of the cooling units 14 fails, remaining operational cooling units 14 increase output capacity for the data center 10.

Figure 9:
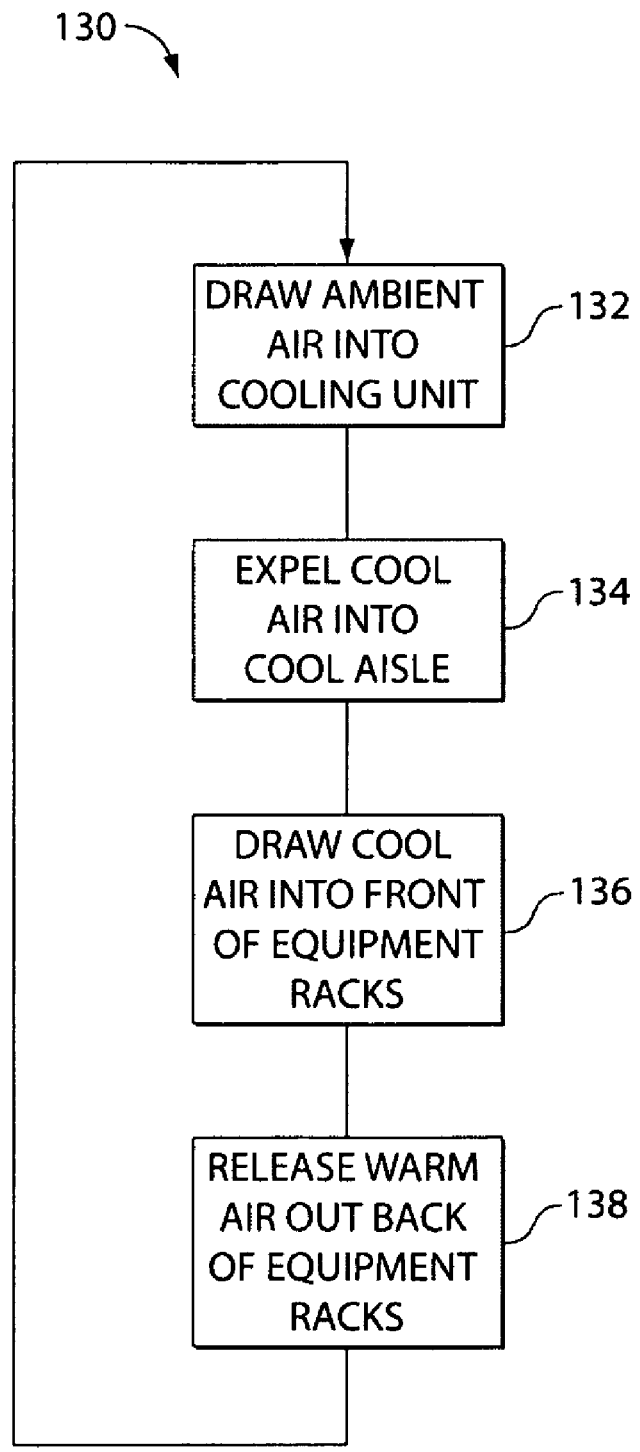
FIG. 9 is a block flow diagram of a process of cooling equipment mounted in a data center.

The cooling unit 14 provides cooling for equipment in the data center 10. Referring to FIG. 9, with further reference to FIGS. 1-8, the data center 10 is configured to perform a process of cooling equipment stored in enclosed racks using an infrastructure having independent cooling units. The process 130 includes the stages shown, although the process may be altered, e.g., by having stages added, deleted, or moved relative to the stages shown.

At stage 132, air enters through the return ports 56 on the back sides 30 of the cooling units 14 to cool the equipment stored in the racks 12. As the air passes through the cooling unit 14, the temperature of the air decreases. For example, the air can pass through a heat exchanger 52 and may be pulled through the cooling unit 14 with fans.

At stage 134, the cool air is expelled into the cold aisle 26 out of the front side 29 of the cooling units 14. The cool air is expelled out of the cooling units 14 along the height of the cooling units to be received along substantially the height of the racks 12 and is preferably released with a substantially uniform flow rate over the height of the racks 12 (i.e., at substantially the same flow rate at any vertical point). The cool air moves horizontally down the length of the cold aisle, and/or fills, the cold aisle 26.

At stage 136, the equipment racks 12 draw the cool air from the cold aisle 26. Equipment in racks 12 is cooled by the cool air entering the front faces 27 of the racks 12 along the height of the racks. The air increases in temperature as it passes through the equipment racks 12 and heat transfers from the equipment in the racks 12 to the air. The warmer air is expelled out of the back sides 28 of the equipment racks 12 and into the surrounding room, or hot aisle of the data center, at stage 138, which completes the cooling cycle. The air in the surrounding room, or hot aisle of the data center, is then drawn into the cooling units 14 at stage 132 once again, and the cycle continues. The process 130 can be accomplished using a number of alternative cooling units 14 having a turning member 44, such as those described in FIGS. 3A-5H.

Figure 10A:
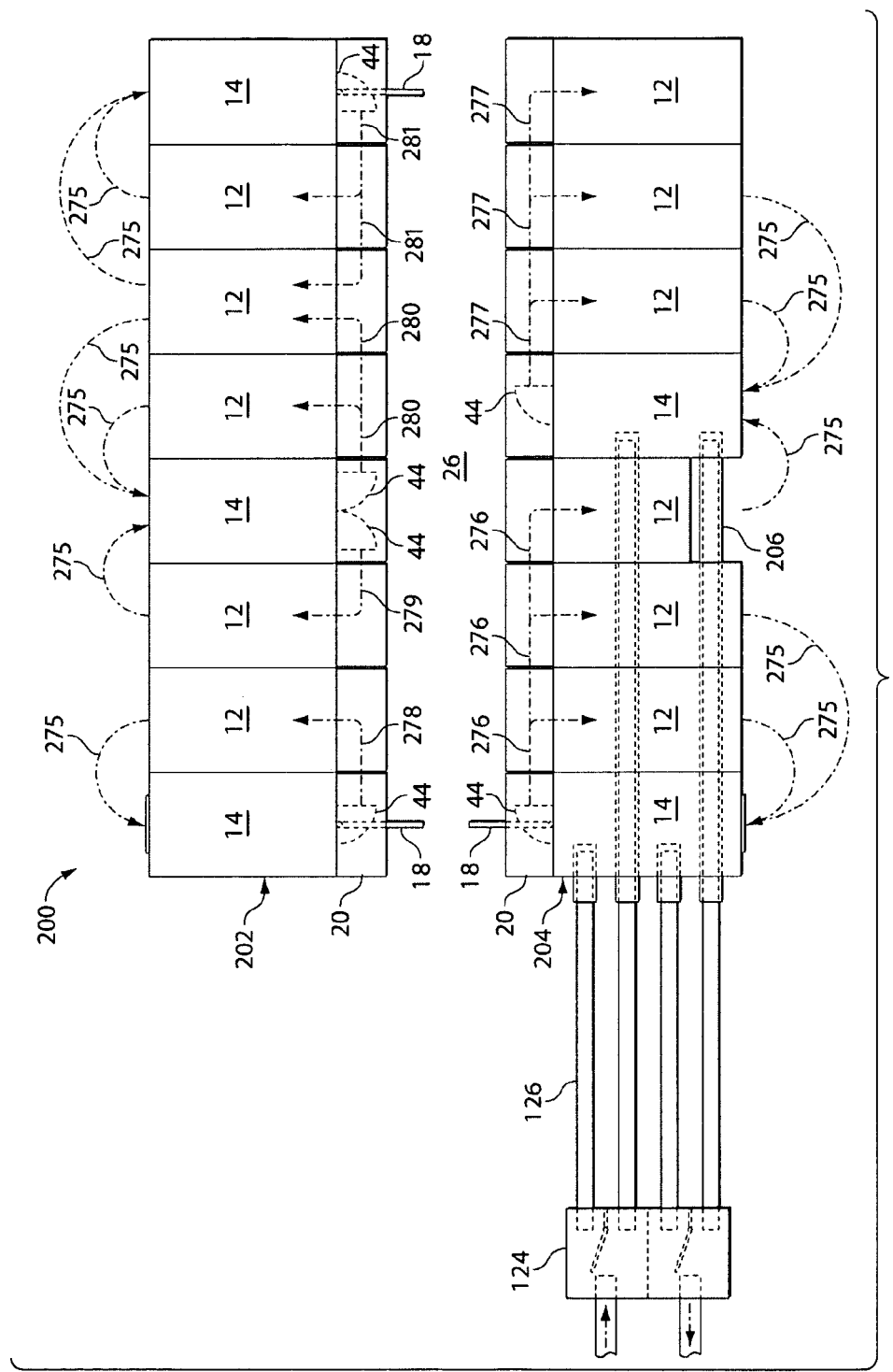
FIG. 10A is a top view of an alternative configuration of a data center cooling system for rack-mounted equipment.
Figure 10B:
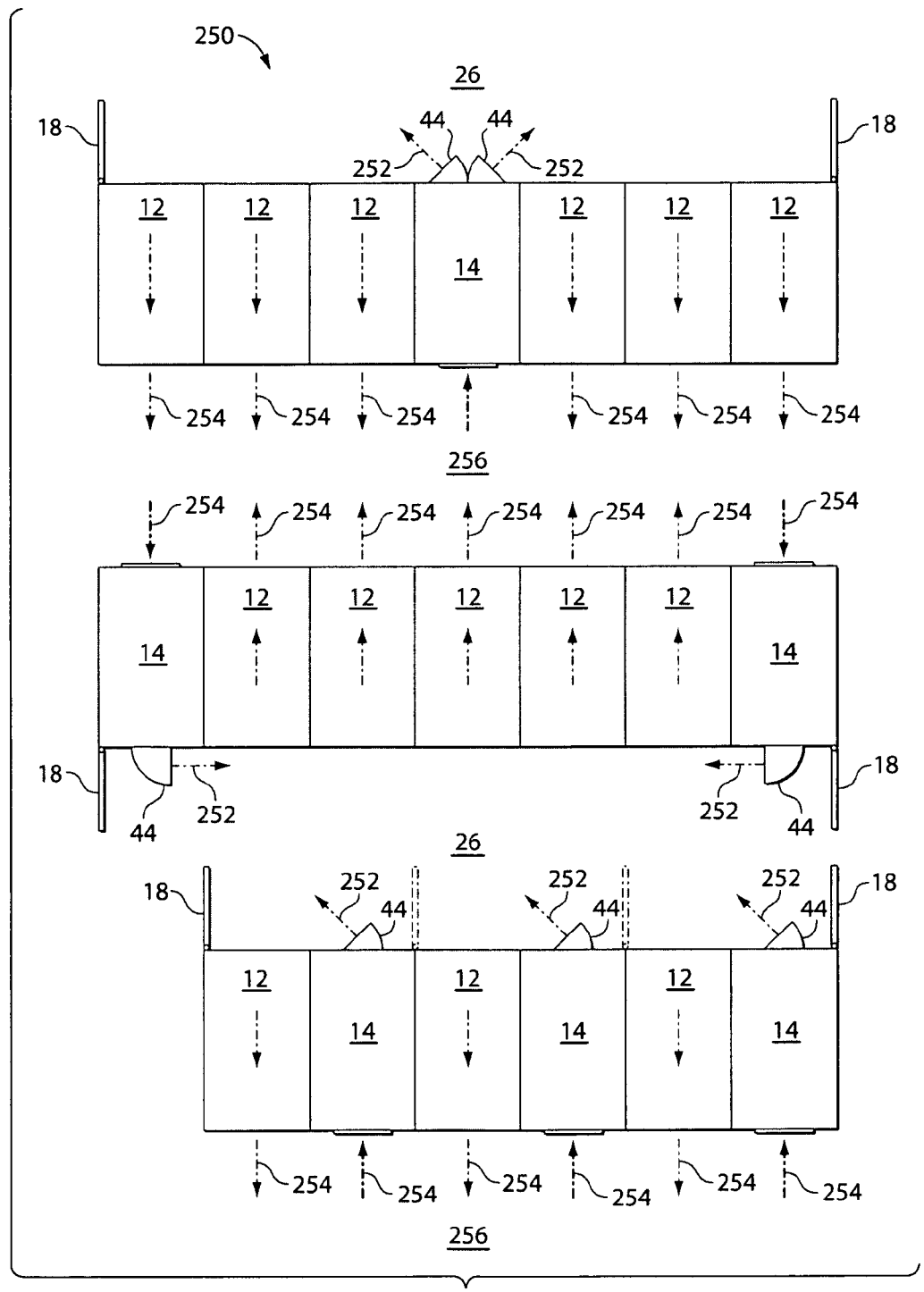
FIG. 10B is a top view of an alternative configuration of a data center cooling system for rack-mounted equipment.

The data center 10 as shown in FIG. 1 can be modified in a number of ways to create alternate cooling systems to accomplish equipment rack cooling as described by process 130 of FIG. 9. For example, the modular cooling units 14 can be added to the data center 10 or removed from the data center 10 as desired, e.g., to accommodate different equipment configurations to be cooled and to provide redundant cooling. Cooling units 14 can be added/removed in addition to or instead of cooling units 14 being placed at the end of rows. Referring to FIGS. 10A-10C, alternative configurations of a cooling system for a data center are shown. The configuration of the cooling system in each data center can consider factors including, but not limited to, the number of racks in the data center requiring cooling, the type and amount of equipment in the racks, the length of the rack rows, the location of additional cooling units in the rows, the width of the cold aisle, the size of the racks, and the ceiling height of the data center.

In the alternative embodiment shown in FIG. 10A, multiple cooling units 14 are included in a data center 200. The data center 200 includes a row 202 and a row 204, the cooling units 14 and the equipment racks 12. The data center 200 further includes the lower restriction panels 18, the upper restriction panels 20, the turning members 44, the manifold 124 and fluid supply/return lines 126. The racks 12 include a water catch 206 positioned in proximity to the fluid supply/return lines 126. Arrows 275, 276, 277, 278, 279, 280, and 281 illustrate the direction of airflow through the data center 200.

In FIG. 10A, a number of cooling units 14 are positioned throughout the rows 202, 204 of racks, in addition to the cooling units 14 positioned at the ends of the rows 202 and 204. A cooling unit 14 is positioned at the end of the row 202 and directs air to the right, in the direction of arrow 276. A second cooling unit 14 is positioned in a mid-portion of the row 202 and also directs air to the right, in the direction of arrow 277. In combination, the cooling units 14 of row 202 cool the equipment racks 12 of the row 202.

In the row 204, three cooling units 14 are included to cool the equipment racks 12. In addition to the cooling units 14 positioned at the ends of the row 204, a cooling unit 14 is positioned in a mid portion of the row 204 having a turning member 44 directing air to the left, indicated by arrow 279, and a turning member 44 directing air to the right, indicated by arrow 280. Adjacent turning members 44 on a single cooling unit 12 may, as shown, split the cool air released from the cooling unit 14 for cooling in two directions in the data center 200. Arrows 275 indicate airflow out of the backs of the equipment racks 12 and toward the back intakes 30 of the cooling units 14 for recycling.

With continued reference to FIG. 10A, the cooling units 14 receive a fluid from the manifold 124 to cool the air before it is released from the cooling unit 14. The cooling lines 126 run from the manifold 124 to the cooling units 14 to cool the circulated air. The liquid catch 206 is positioned around each of the cooling lines 126 to collect moisture from the lines and substantially prevent moisture from entering the equipment racks 12. The liquid catch 206 is modular, i.e., it can be removed, shortened, or lengthened as the rows change in length. Alternatively, the cooling lines can be double-walled to protect the equipment rack from water in the event of a leak. A plurality of supply and return lines 126 can run from the manifold 124, and each cooling unit 14 can receive a supply line 126. Further, as additional cooling units 14 are added to a data center 200, additional supply and return lines 126 can be added. The manifolds can split the cooling lines 126 into multiple low pressure lines of polyethylene cross flexible tubing, braided stainless or braided plastic tubing, for example.

In FIG. 10B, a data center 250 provides zones of cooling using the cooling units 14 having turning members 44. Cooling to racks 12 is provided in multiple zones. Each zone is serviced by one or more cooling units. A cooling unit 14 provides cool air to one or more racks 12 in a zone. Air flow measurements and temperature measurements can be taken to determine cool air requirements of one or more racks 12. Arrows 252 indicate air delivered to the racks in the cold aisles 26. Arrows 254 indicate return air delivered to the cooling units 14 in the warm aisles 256. At least a portion of a volume of the warm return air exiting the back of the racks 12 is returned to the cooling unit 14 for recycling, shown by arrows 256. Airflow can be controlled based on the zone, i.e., the aggregate feedback from the racks 14 in a zone. The zones of cooling can include one racks, three racks, five racks or any of a number of racks 12.

Figure 11A:
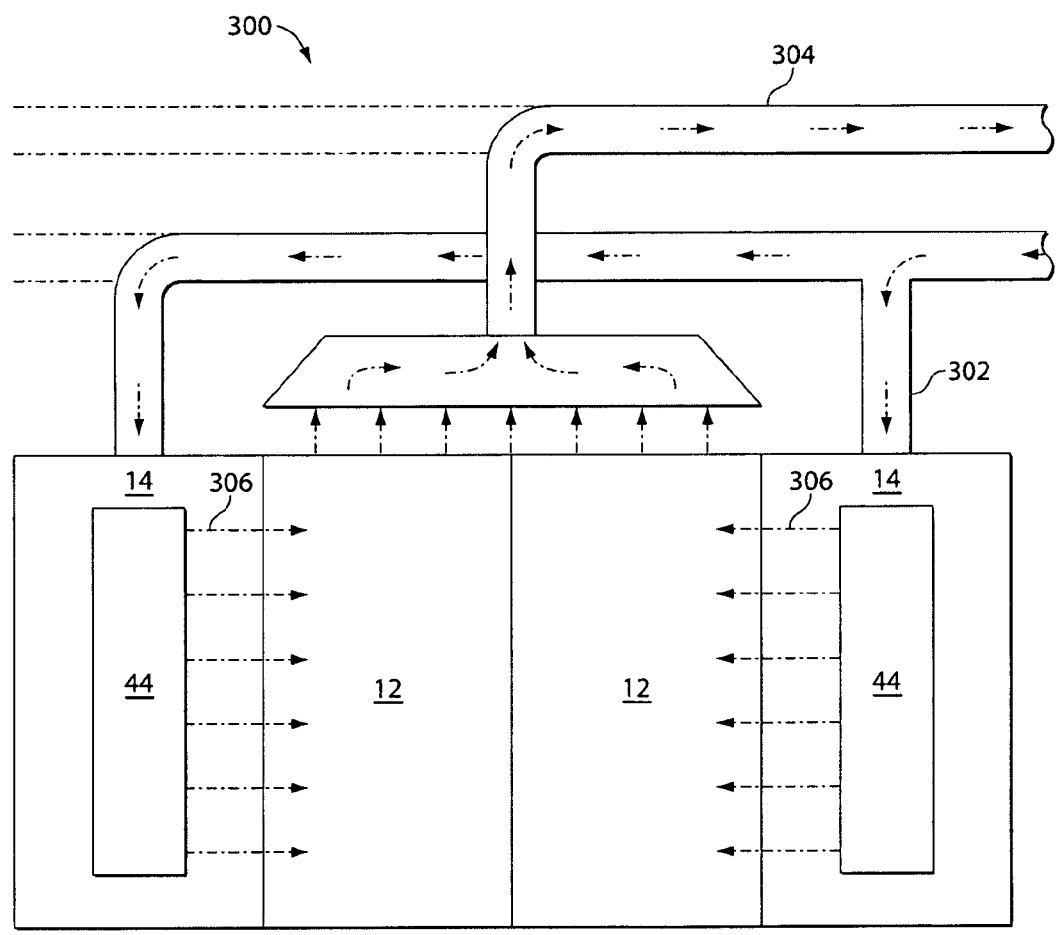
FIG. 11A is a front perspective view of a data center showing an alternative cool air supply.

The data centers as described with respect to FIGS. 8 and 10A include a building manifold 124 that provides liquid cooling options to the cooling units 14. Referring to FIG. 11A, a data center 300 includes a separate cool air supply ducted to the cooling units 14. The data center 300 includes the cooling units 14 having turning members 44, the equipment racks 12, a main supply duct 302 and a main return duct 304. The data center 300 also includes a central air handler (not shown). The central air handler provides cool air to the cooling units 14, such that the local cooling units 14 act to move the cool air delivered by the central air handler through the supply ducts 302. Cool air is supplied to the cooling units via supply ducts 302. Air is released through the cooling units 14 and out of the turning members 44 in the direction of arrows 306 to cool the racks 12. After circulating through the racks 12, the air is released into a return duct 304, which may be, for example, a ceiling duct. Air is delivered to the central air handler via the return ducts 304 for recirculation. Both the supply duct 302 and the return duct 304 can be positioned in the ceiling of the data center 300, or the ducts can be positioned within the data center 300. Providing the cool supply air via ducts eliminates the presence of liquid lines in the data center. Further, a central air handler 430 can provide efficient cooling and air delivery.

Figure 11B:
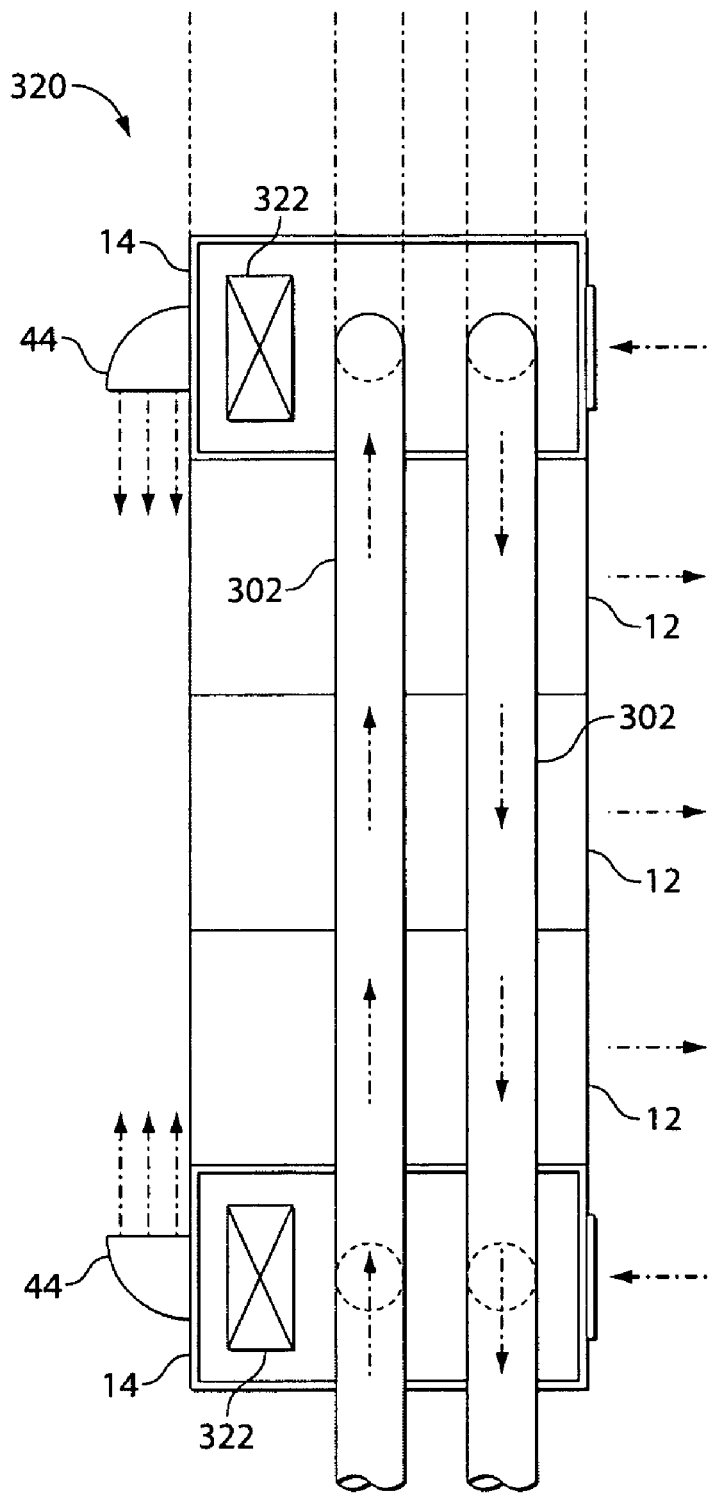
FIG. 11B is a top perspective view of a data center showing an alternative cool air supply.

In FIG. 11B, the data center 320 includes the supply ducts 302 coupled to the cooling units 14. Return air from the racks 12 is handled such that hot return air is returned through the cooling unit 14 and returned to a central air handler for cooling. The supply ducts 302 are modular, i.e., more can be added to accommodate additional cooling units 14 and equipment racks 12.

Figure 12A:
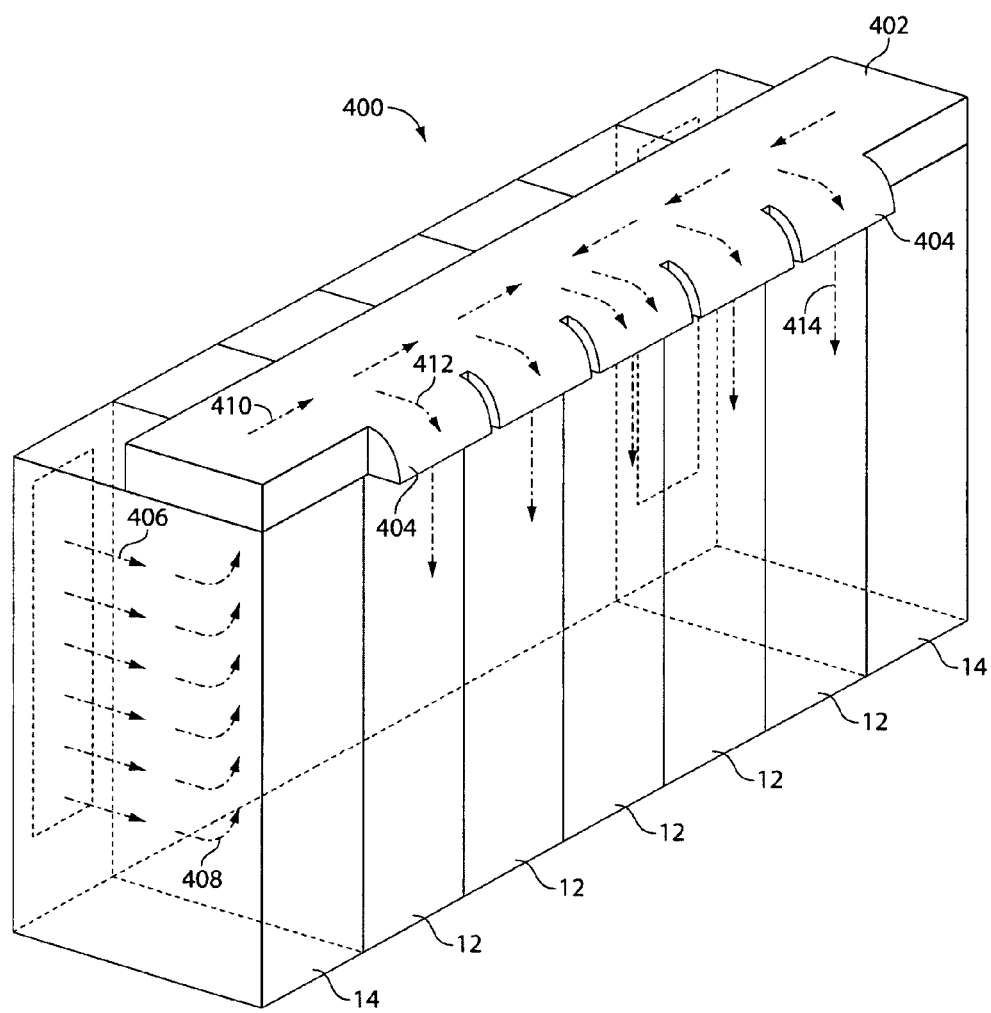
FIG. 12A is a perspective view of a data center showing an alternative cool air supply.
Figure 12B:
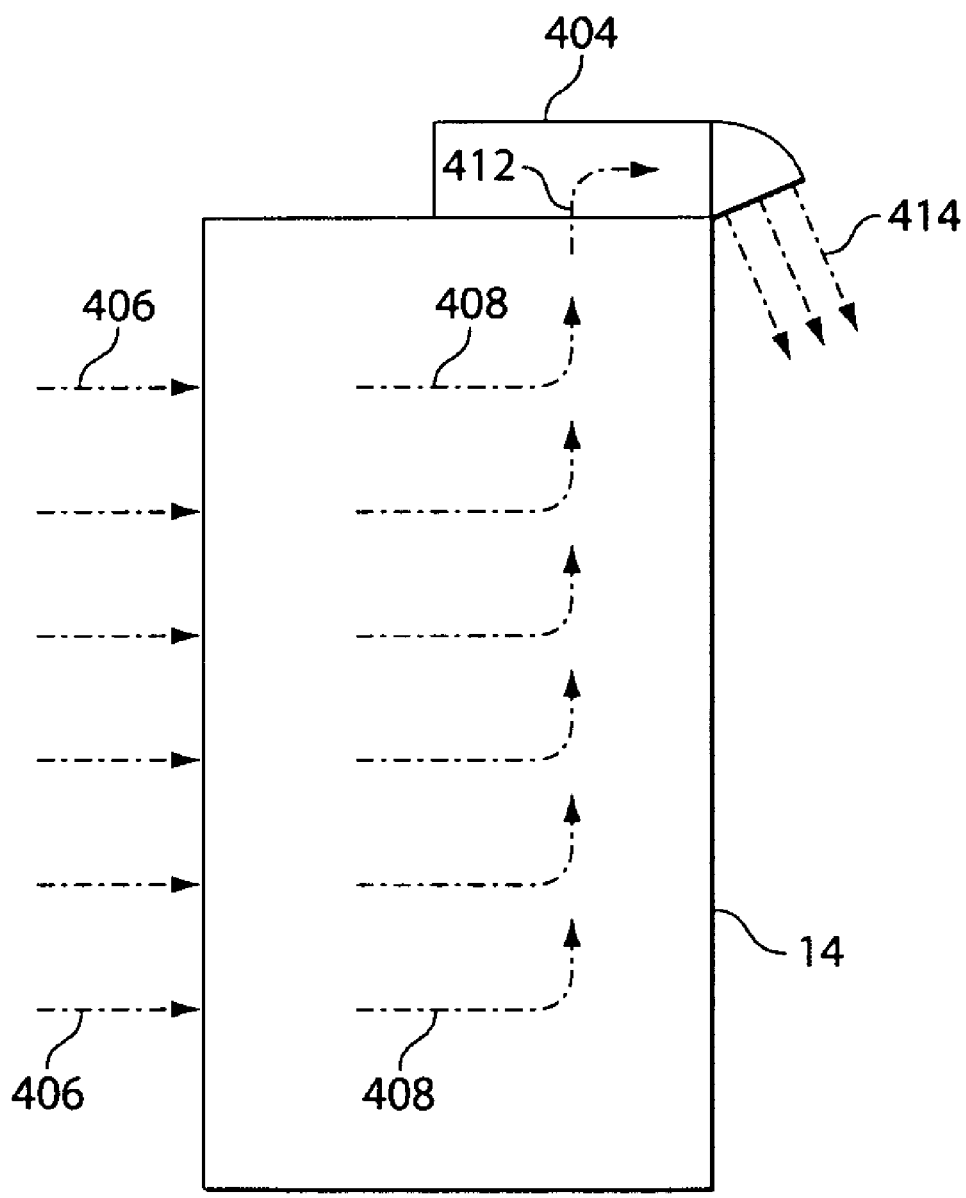
FIG. 12B is a side view of the data center of FIG. 12A showing one alternative cool air supply.
Figure 12C:
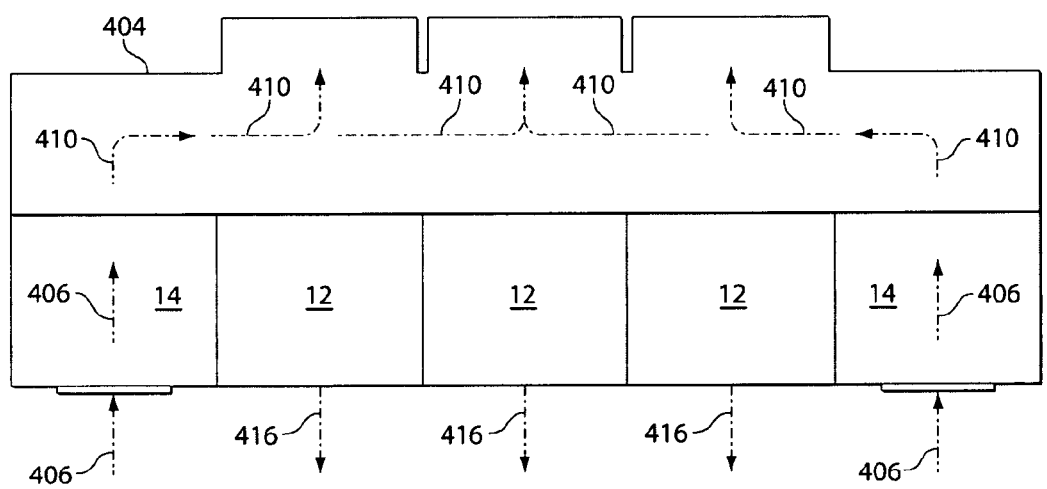
FIG. 12C is a top view of the data center of FIG. 12A showing the alternative cool air supply.

Alternative characteristics of the turning member 44 are possible and envisioned. Referring to FIGS. 12A-12C, alternative embodiments of the invention can include a plenum that resides above the equipment racks to deliver air to individual racks 12. Referring to FIG. 12A, a data center 400 includes the cooling unit 14, equipment racks 12, and a plenum 402. The plenum 402 is configured in rack-width sections. The plenum 402 includes top turning members 404. The air is cooled via local cooling in the cooling unit 14, or via any of a number of ways discussed, such as via delivery from a building manifold, an air duct system, etc. Cool air in the plenum 402 is delivered to the racks 12 through the top turning members 404. Air flows through the air return into the cooling unit 14 in the direction of arrows 406. The air is cooled in the cooling unit 14 and diverted toward the top of the cooling unit in the direction of arrows 408. For example, fans in the cooling unit 14 or in the plenum 402 can push or pull the air into the plenum 402. When in the plenum, the air moves along the plenum in the direction of arrow 410, to the top turning members 404, and down the front face of the racks 12, in the direction of arrows 414. The top turning members 404 direct the air down the face of each of the racks 12 to cool the equipment in the racks 12. The racks 12 draw the cool air in to cool equipment in the racks 12. FIGS.

12B and 12C further illustrate the airflow through the cooling rack 14 and into the plenum 404. The plenum 402 can be a single plenum having one or more fans positioned along the length of the plenum 402 to assist in delivery of air to the racks 12. The plenum 402 can be a sectional plenum 402, modular in design so that as racks 12 are added or removed from the data center, the plenum 402 can be adjusted. The plenum 402 releases cool air over the width of the front face of the individual racks 12. Fans can be positioned anywhere between the return air inlet and the exhaust air outlet in the plenum 402 to assist airflow. Racks 12 can be inserted in or removed from a row with the addition of plenum sections, but with substantially no other changes to the data center.

Figure 13:
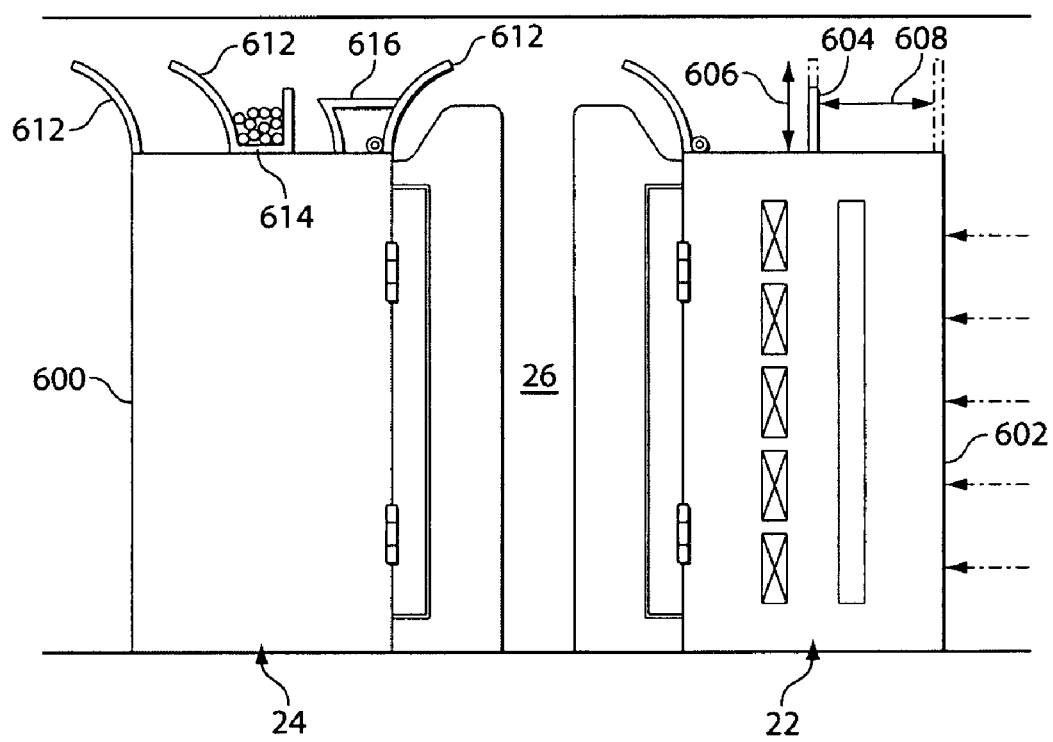
FIG. 13 is a side view of a data center having alternative upper restriction panels.

Alternative embodiments of the upper restriction panels are possible and envisioned. Various upper restriction panels are shown in FIG. 13. End cabinets 600 and 602 can be equipment racks or cooling units. The end cabinets 600, 602 can incorporate turning members, as in FIGS. 3A-5H, or top plenums as in FIG. 12A-12C. A first alternative top panel 604 is positioned midway on a top face of the cabinet 602. The top panel 604 can be expanded or retracted in the direction of arrow 606, i.e., toward or away from the ceiling of the data center. The top panel 604 can further be positioned along any portion of the top face of the cabinet 602. For example, the top panel 604 can be moved toward a front face of cabinet 602 or toward a back face of cabinet 602, as shown by arrow 608.

An alternative top panel 612 is an arched member that may be positioned, e.g., at a back edge, a middle position, or a front edge of the top face of the cabinet 600. Alternatively, the top panel 612 can be straight and placed on an angle extending upward. Multiple upper restriction panels can be used, as shown on the cabinet 600. Further, the upper restriction panels can be a portion of a cable tray 614, which holds cables associated with the data center over the top of the rows 22 and 24. Any of the upper restriction panels of FIG. 13 can incorporate cooling liquid line trays 616. The cooling liquid line trays 616 can include run-out channels for liquid if a leak is present. Covers can be added to the trays. Run-out channels for liquid can return to the cooler condensation pump and can be set to alarm if level or rate of pumping exceeds a pre-set limit. The upper restriction panels can be rigid or flexible panels. For example, the upper restriction panels can be mesh shades that are manually pulled into position as desired. A combination of upper restriction panels can be employed to effect restricted mixing of return air and cool air supply to the racks.

Figure 14A:
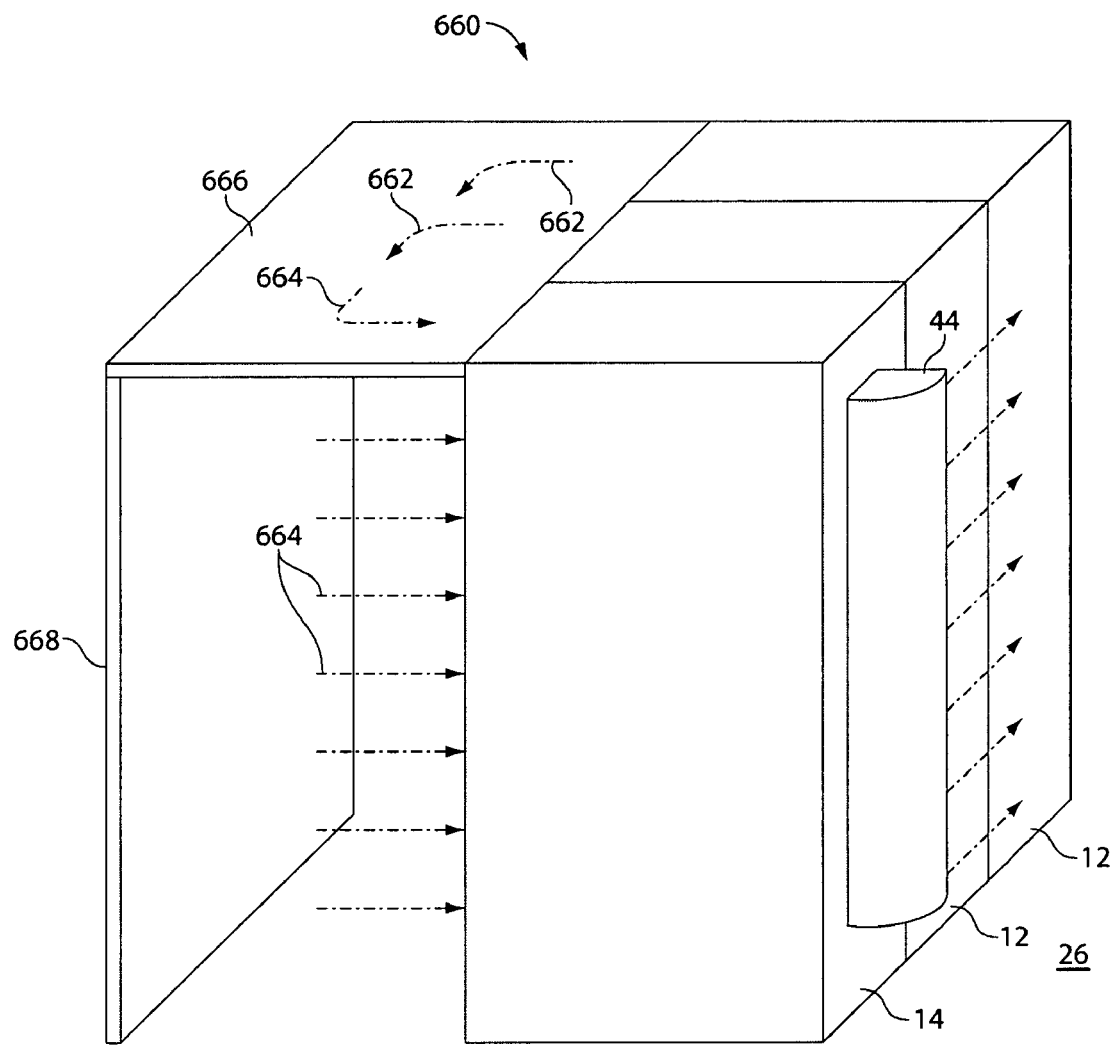
FIG. 14A is a side view of a data center having an alternative air restriction configuration.

An alternative to upper restriction panels includes a blocked hot aisle, shown in FIG. 14A. A system 660 includes one or more cooling units 14 having a turning member 44 to cool one or more equipment racks 12. Air flowing out of the racks 12 in the direction of arrows 662 is contained or partially contained by a roof 666 and wall 668. The return air is contained from flowing over the tops of the racks 12 or otherwise mixing with cool air in the cold aisle 26. The return air flows into the cooling unit 14 for recycling, shown by arrows 664. The wall 668 and the roof 666 can be modular such that it is added or removed as the configuration of the row changes.

Figure 14B:
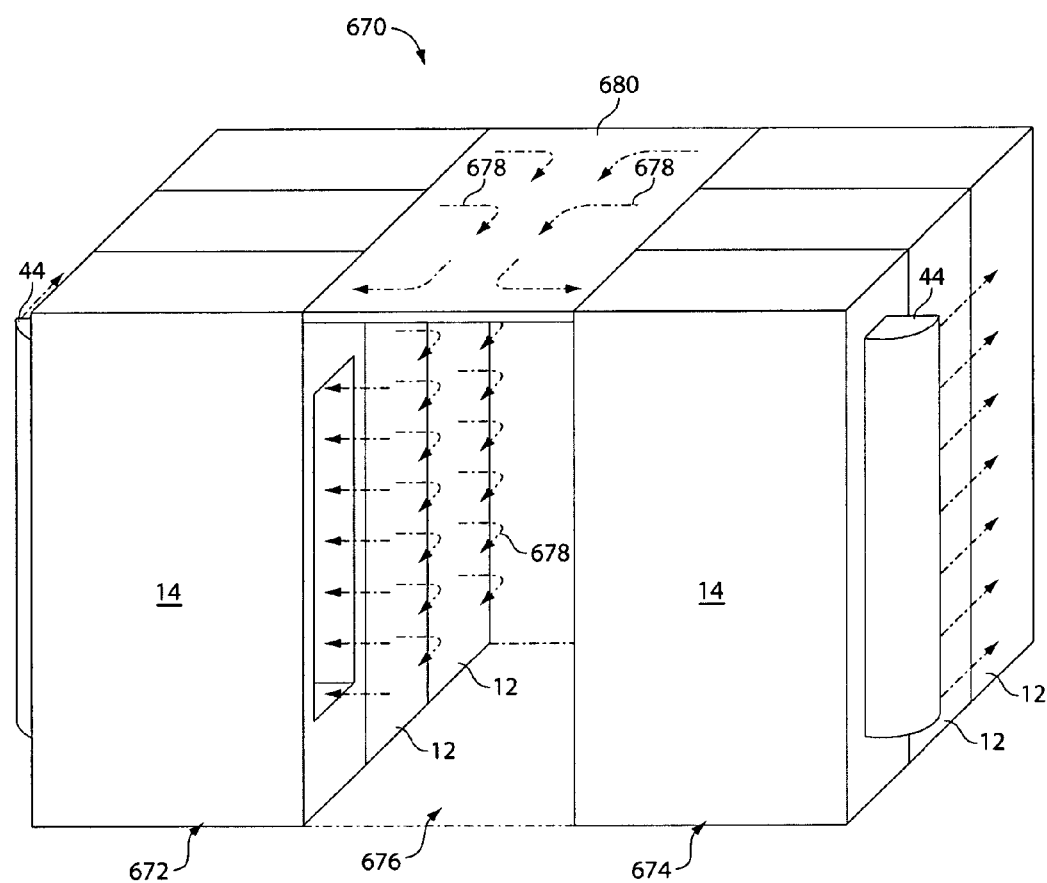
FIG. 14B is a perspective view of a data center having an alternative air restriction configuration.

Referring to FIG. 14B, a roof panel can act as an air mixing restriction member. The system 670 includes a first row of racks 672, a second row of racks 674, cooling units 14 and racks 12. A roof 680 joins the racks in row 672 with the racks in row 674, e.g., the roof spans the distance between the rows 672 and 674. The roof can span the distance between the row 662 and the row 664 to substantially seal off the hot aisle 670. The cooling units 14 include the turning members 44. The backs of the cooling units 14 and the backs of the remaining racks in the rows 12 face one another. Return air is released into a hot aisle 676 in the direction of arrows 678. Air in the hot aisle 676 can be separated from the cool air released to the racks 12. Mixing of the cool air released from the cooling units and hot air released from the racks 12 is restricted. Rack rows having backs that face a wall or other structure, as opposed to racks positioned adjacent to a second row of racks, can incorporate the hot aisle blocking using the roof panel 680. Air restriction members can be placed at each end of the hot isle. The restriction panels can cover all or a substantial portion of the open area at the end of the rows, thereby fully enclosing the hot aisle or substantially closing off the end of the rows.

Figure 15A:
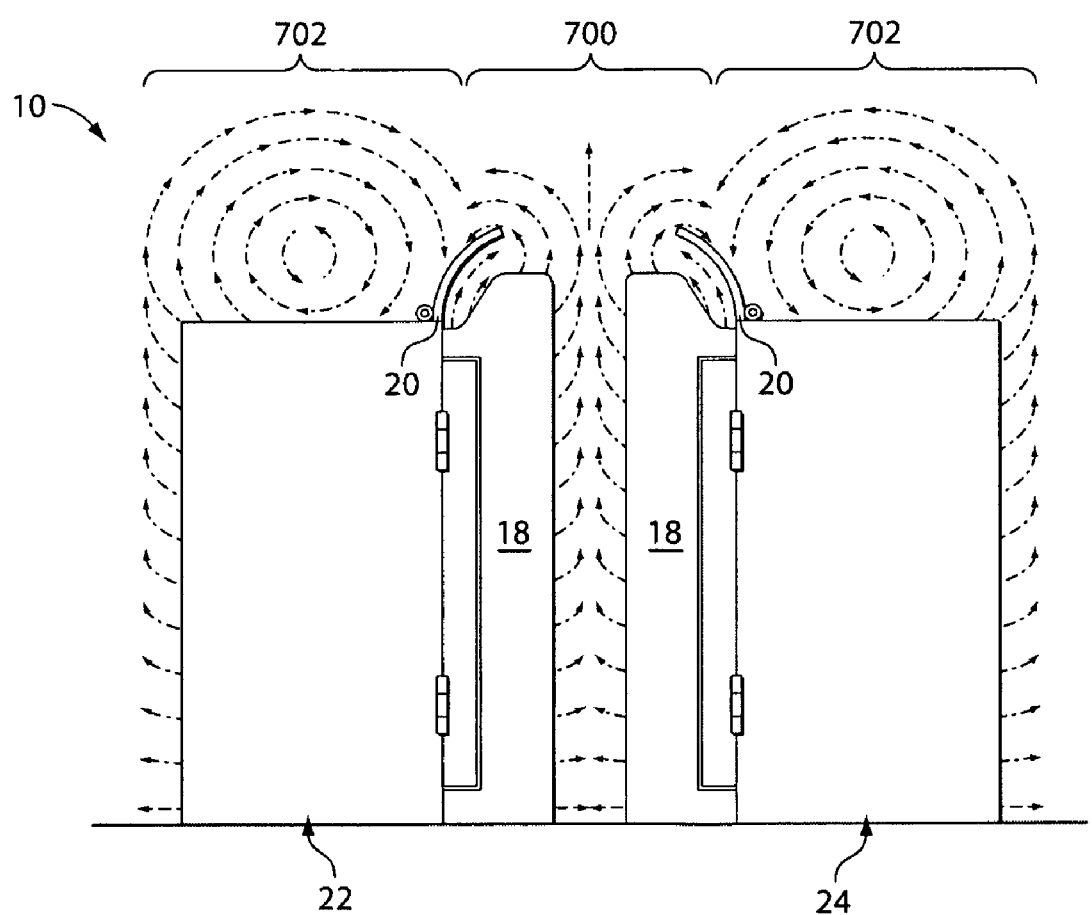
FIGS. 15A-15C are air flow diagrams showing the data center of FIG. 1.
Figure 15B:
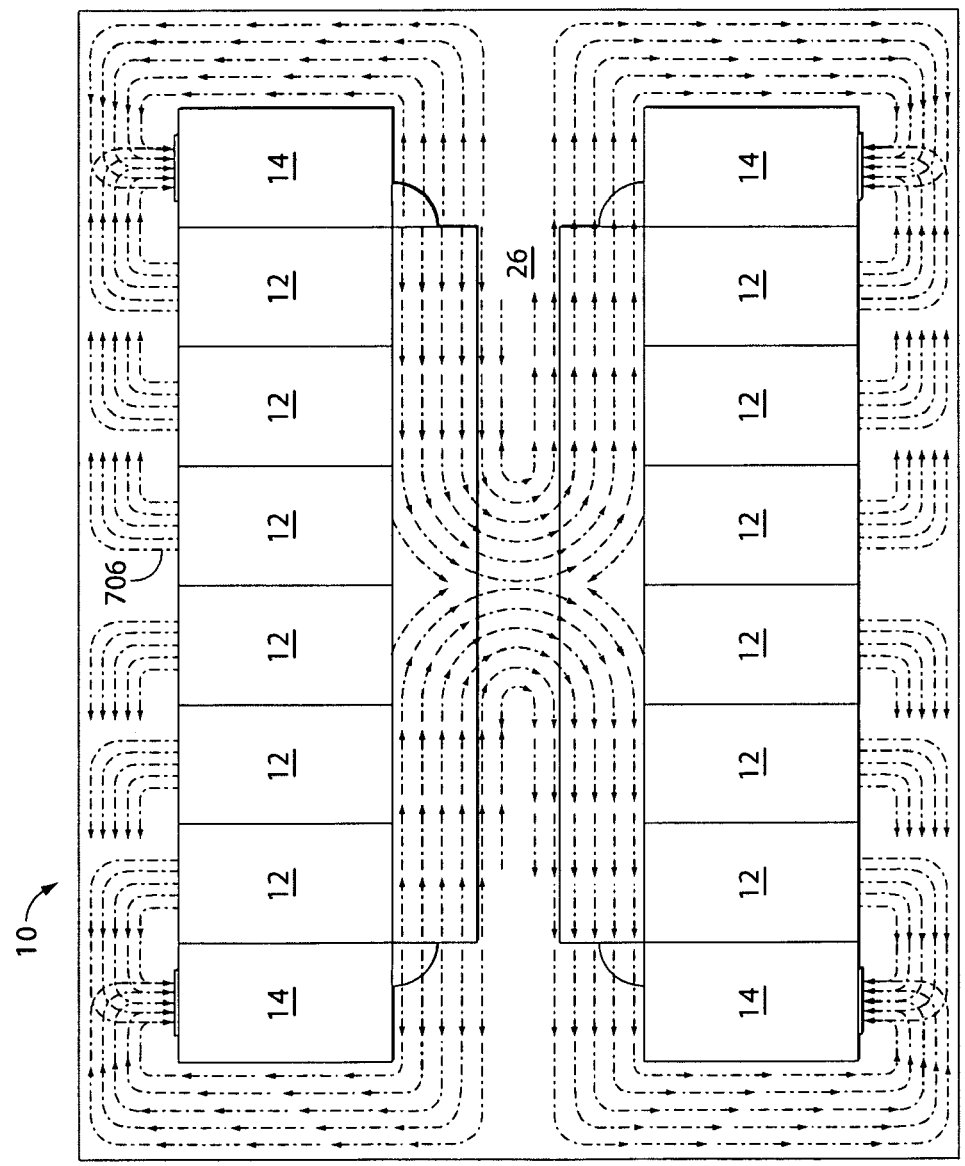
Figure 15C:
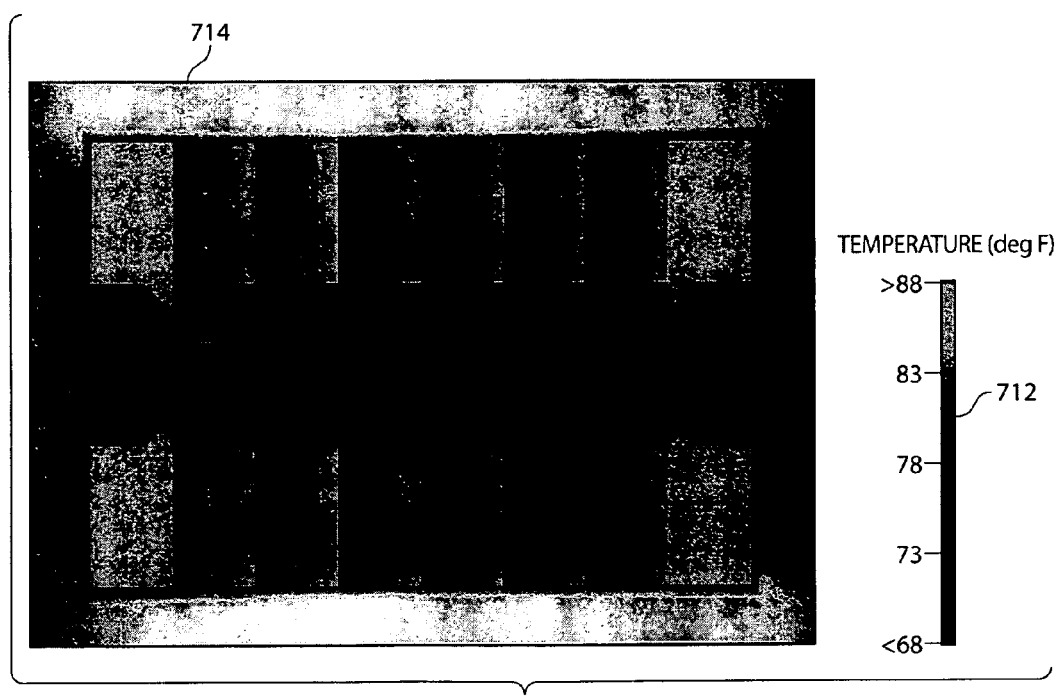

In FIGS. 15A-15C, air flow diagrams of the data center 10 illustrate the restriction of mixing of cold air and warm air in the data center 10. In FIG. 15A, the data center 10 includes upper restriction panels 20 and lower restriction panels 18. The cold air in zone 700 is released from cooling units in rows 22 and 24. The cold air remains substantially within zone 700 to cool the racks in rows 22 and 24. The cold air is substantially restricted by the upper restriction panels and the lower restriction panels. Warm air released from the racks after the racks have been cooled is released into zones 702. The warm air remains substantially in zones 702, rather than mixing with air in the zone 700.

In FIG. 15B, a top perspective of the air flow in a data center 10 further illustrates the movement of cool air in the cold aisle 26. The volume of cold air released from the cooling units 14 fills in the cold aisle 26 and/or sends cool air down the row to cool the racks 12. With continued reference to FIG.1 5B and referring to FIG.1 5C, an air temperature indicator 712 corresponds in color to the temperature gradient 714 Cool air is substantially contained in the cold aisle 26 of the data center 10. Warm air is substantially prevented from entering the data center cold aisle 26, thus cooling the racks 12.

Other embodiments are within the scope and spirit of the invention and the appended claims. The cooling rack may incorporate multiple air release vents that can be directed to different heights so that the vertical air curtain has a greater volume at particular heights. Data centers may be configured to distribute gases other than air. Additionally, a refrigerant or other coolant may be used rather than cold water. Further, a controller can be disposed and configured to monitor data center air temperatures, flow rates, current and/or power draw, and control rack cooling based on the data, including, e.g., adjusting the turning members to direct cool air to the appropriate racks. A data center may contain a single equipment rack 12 having a single cooling unit 14 creating a cool aisle for a single rack. The cooling unit may be positioned at the ends of rows of cabinets, or in the middle of rows, or both.

Further, the upper restriction panels may comprise a single panel on each of the respective rows of the cool aisle, rather than individual panels for each of the cabinets in the rows. The upper restriction panel may alternatively be a single panel creating a cover for the cool aisle, the cover being comprised of a porous material allowing light and water to penetrate the cover. The upper restriction panels can extend to the ceiling of the data center. Other solutions for restricted air mixing can be incorporated into the data center instead of, or in addition to lower restriction members, upper restriction members, enclosed hot aisles, roofs, etc. Equipment racks can incorporate drip edges to allow water runoff, e.g., in the event that a sprinkler system is activated. The upper restriction panels or the racks can also incorporate Blue/Amber/Red LED panels to give a color readout of the status of the temperature in a particular cabinet. Also, flow loss detectors can be placed in the cooling lines to provide feedback to the cooler or a monitoring system. An intake filter on the cooling unit can have zinc whisker monitoring. Also, condensate removal and pumping can be parallel and redundant.

The cooling units can have additional turning members oriented to draw exhaust air from the equipment racks and through the cooling units. Multiple turning members can be positioned on a back portion of the cooling unit, as well as the front face of the cooling unit. Further, lower restriction panels can be positioned to extend from a back face of the cooling units or equipment racks to restrict hot air released from the racks from mixing with cool air in the cold aisle. One or many lower restriction panels can be positioned to extend from the front faces and/or the back faces of the cooling units and the racks.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A data center comprising:
   an electronic equipment rack having a front face and a back face; and
   a cooling unit positioned adjacent to the rack, the cooling unit having a front face and a back face, the cooling unit being configured to exhaust cooled air from the front face of the cooling unit to cool the rack;
   an air turning member positioned on the front face of the cooling unit to direct the air toward the rack;
   wherein the cooling unit is configured to release the cooled air along a substantial portion of a height of the front face of the rack; and
   wherein the air turning member is reversible.

2. A data center comprising:
   an electronic equipment rack having a front face and a back face; and
   a cooling unit positioned adjacent to the rack, the cooling unit having a front face and a back face, the cooling unit being configured to exhaust cooled air from the front face of the cooling unit to cool the rack;
   an air turning member positioned on the front face of the cooling unit to direct the air toward the rack;
   wherein the cooling unit is configured to release the cooled air along a substantial portion of a height of the front face of the rack; and
   wherein the air turning member is expandable and retractable.

3. A data center comprising:
   an electronic equipment rack having a front face and a back face; and
   a cooling unit positioned adjacent to the rack, the cooling unit having a front face and a back face, the cooling unit being configured to exhaust cooled air from the front face of the cooling unit to cool the rack;
   an air turning member positioned on the front face of the cooling unit to direct the air toward the rack;
   wherein the cooling unit is configured to release the cooled air along a substantial portion of a height of the front face of the rack; and
   wherein the air turning member is configured to direct air released from the cooling unit in more than one direction substantially simultaneously.

4. A data center comprising:
   an electronic equipment rack having a front face and a back face; and
   a cooling unit positioned adjacent to the rack, the cooling unit having a front face and a back face, the cooling unit being configured to exhaust cooled air from the front face of the cooling unit to cool the rack;
   wherein the cooling unit is configured to release the cooled air along a substantial portion of a height of the front face of the rack; and
   an air turning member positioned in an internal portion of the cooling unit to deliver cooled air along substantially a portion of the height of the rack.

5. The data center of claim 4 wherein the air turning member is configured to direct air released from the cooling unit in more than one direction substantially simultaneously.

6. A data center comprising:
   an electronic equipment rack having a front face and a back face; and
   a cooling unit positioned adjacent to the rack, the cooling unit having a front face and a back face, the cooling unit being configured to exhaust cooled air from the front face of the cooling unit to cool the rack;
   wherein the cooling unit is configured to release the cooled air along a substantial portion of a height of the front face of the rack; and
   wherein the cooling unit is configured to adjust an airflow rate of the cooled air based on at least one of the power load to the rack and the temperature of the air exhausted from the rack.

7. A method of cooling electronic equipment contained in racks in a data center, the method comprising:
   drawing air from an area proximal to a front face of an electronic equipment rack, the electronic equipment rack being configured to draw air into the front face of the rack and expel heated air from a back face of the rack;
   heating the drawn-in air in the rack;
   expelling the heated air from the back face of the rack;
   drawing the heated air into a back face of a cooling unit positioned proximal to the rack;
   cooling the air as the air passes through the cooling unit; and
   releasing the cooled air along substantially one of the height of the front face of the rack or a width of the front face of the rack;
   wherein releasing further comprises forcing air from a plenum positioned on a top portion of the racks.

8. A method of cooling electronic equipment contained in racks in a data center, the method comprising:
   drawing air from an area proximal to a front face of an electronic equipment rack, the electronic equipment rack being configured to draw air into the front face of the rack and expel heated air from a back face of the rack;

heating the drawn-in air in the rack;

expelling the heated air from the back face of the rack;

drawing the heated air into a back face of a cooling unit positioned proximal to the rack;

cooling the air as the air passes through the cooling unit;

releasing the cooled air along substantially one of the height of the front face of the rack or a width of the front face of the rack; and adjusting an airflow rate of the cooled air released along substantially one of the height of the front face of the rack or the width of the front face of the rack.

9. A system for cooling equipment placed in racks in a data center, the system comprising:

a plurality of racks, each of the racks having a front face and a back face, wherein the racks are arranged in a first row and a second row such that the front faces of the racks of the first row face the front faces of the racks of the second row; and at least one cooling unit positioned in the first row, the at least one cooling unit having a front face and a back face, wherein the front face of the at least one cooling unit faces the front faces of racks of the second row, the at least one cooling unit being configured to exhaust cooled air from the front face of the cooling unit to cool at least one of the plurality of racks, wherein the at least one cooling unit is configured to release the cooled air along a substantial portion of a height of the front face of the at least one of the plurality of racks.

10. The system of claim 9, wherein the at least one cooling unit includes an air turning member configured to direct air released from the at least one cooling unit near the front faces of the plurality of racks in the data center.

11. The system of claim 9, further comprising a lower restriction panel coupled to the at least one cooling unit and configured to substantially restrict mixing of the air released from the at least one cooling unit with surrounding air in the data center.

12. The system of claim 11, wherein the lower restriction panel is configured to span most, but less than all, of the distance between the first row and the second row.

13. The system of claim 11, wherein the lower restriction panel includes a first door and a second door, and wherein the first door extends a distance from a cooling unit positioned in the first row and the second panel extends a distance from a cooling unit positioned in the second row, and wherein the first door and the second door are configured to return to a closed position after opening.

14. The system of claim 9, further comprising a lower restriction panel coupled to the at least one cooling unit and configured to substantially restrict mixing of the air released from at least one of the plurality of racks with surrounding air in the data center.

15. The system of claim 9, further comprising an upper restriction panel connected to at least one of the plurality of racks and the at least one cooling unit in a position higher than a position of an opening in at least one of the plurality of racks and the at least one cooling unit configured to release air.

16. The system of claim 15, wherein an upper restriction panel is positioned in the first row and an upper restriction panel is positioned in the second row.

* * * * *